United States Patent
Kanou et al.

(10) Patent No.: US 6,172,537 B1
(45) Date of Patent: Jan. 9, 2001

(54) SEMICONDUCTOR DEVICE

(75) Inventors: Hideki Kanou; Masato Matsumiya; Satoshi Eto; Masato Takita; Ayako Kitamoto; Toshikazu Nakamura; Kuninori Kawabata; Masatomo Hasegawa; Toru Koga; Yuki Ishii, all of Kawasaki (JP)

(73) Assignee: Fujitsu Limited, Kawasaki (JP)

(*) Notice: Under 35 U.S.C. 154(b), the term of this patent shall be extended for 0 days.

(21) Appl. No.: 09/286,439

(22) Filed: Apr. 6, 1999

(30) Foreign Application Priority Data

Apr. 7, 1998  (JP) .................................................. 10-094964
Mar. 29, 1999 (JP) .................................................. 11-086851

(51) Int. Cl.[7] .............................. H03K 17/00; H03L 7/00
(52) U.S. Cl. .............................. 327/99; 327/149; 327/47; 327/237; 327/159; 327/158
(58) Field of Search .................................... 327/141, 149, 327/153, 158, 161, 156, 147, 99, 237, 236, 244, 47, 41, 39, 159

(56) References Cited

U.S. PATENT DOCUMENTS

| | | | | |
|---|---|---|---|---|
| 5,475,324 | * | 12/1995 | Tomiyori | 327/145 |
| 5,537,069 | * | 7/1996 | Volk | 327/149 |
| 6,005,904 | * | 12/1999 | Knapp et al. | 327/159 |

FOREIGN PATENT DOCUMENTS 10-209857   8/1998   (JP) .

* cited by examiner

Primary Examiner—Dinh T. Le
(74) Attorney, Agent, or Firm—Arent Fox Kintner Plotkin & Kahn, PLLC

(57) ABSTRACT

A semiconductor device has a DLL circuit or the like for adjusting the phase of an external clock and producing an internal clock that lags behind by a given phase. The semiconductor device further includes a clock frequency judging unit for judging the frequency of a first clock on the basis of an indication signal indicating a delay value of the first clock in the DLL circuit or the like to output a control signal; and a clock selecting unit for selecting either one of the first clock and the second clock, in response to the control signal.

5 Claims, 19 Drawing Sheets

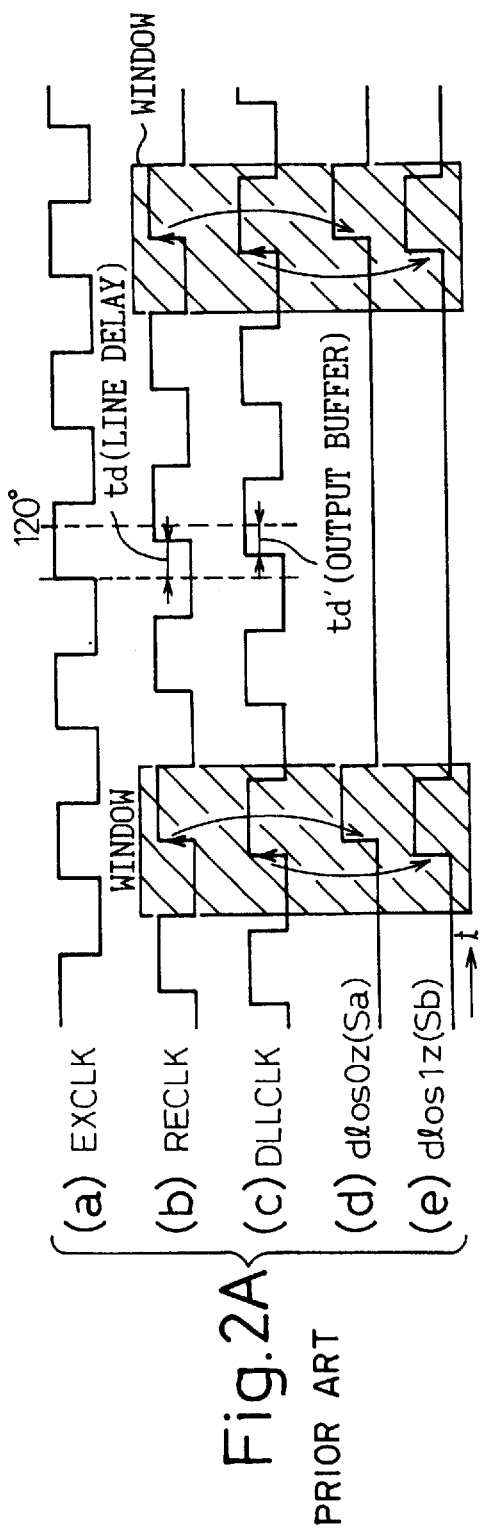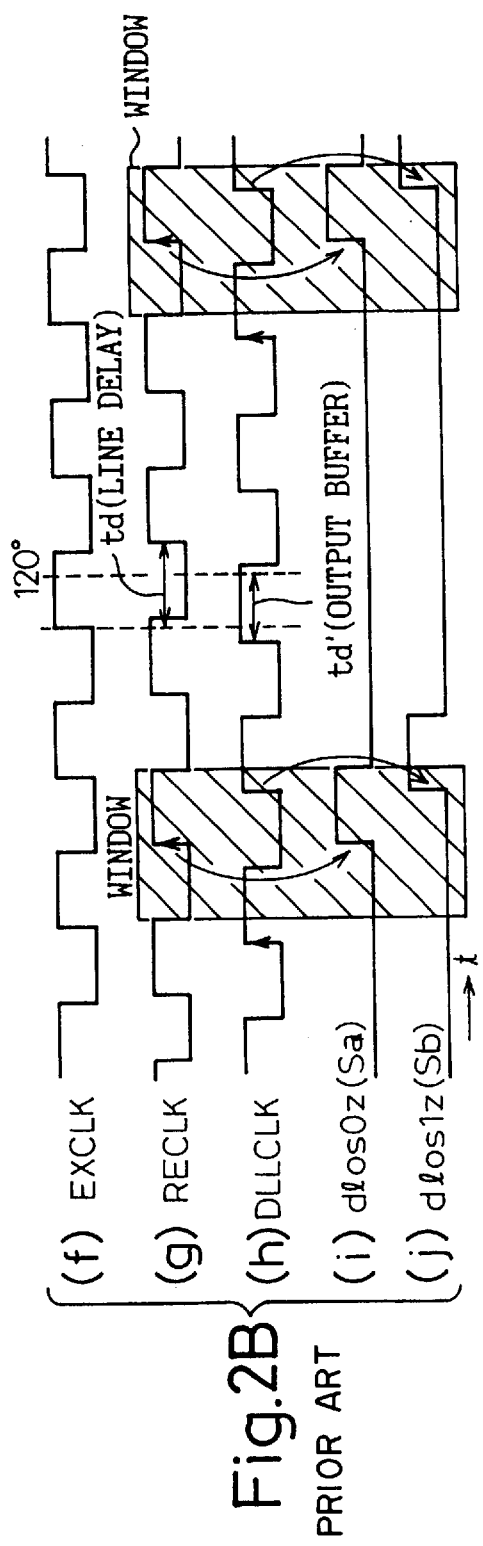

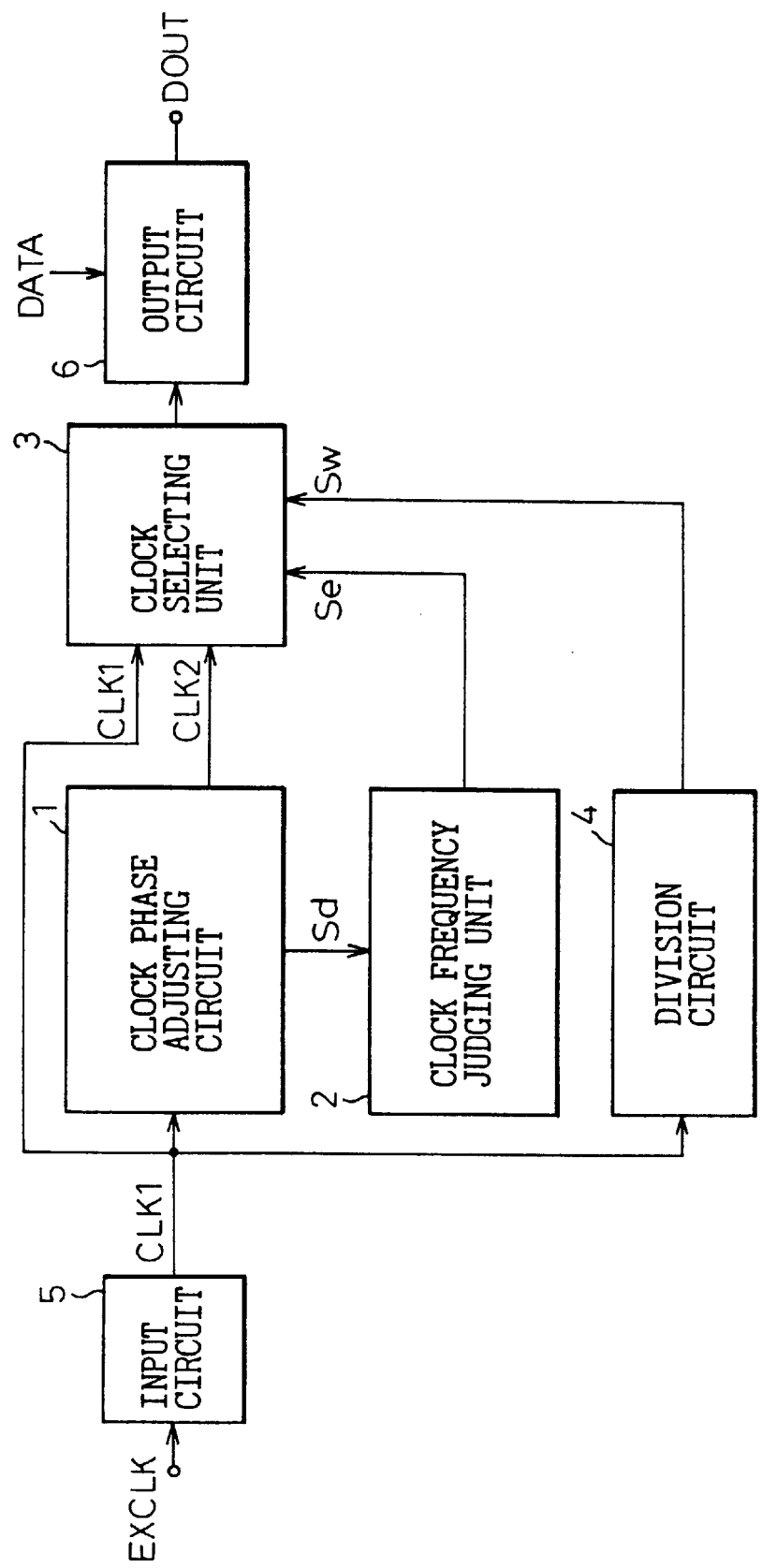

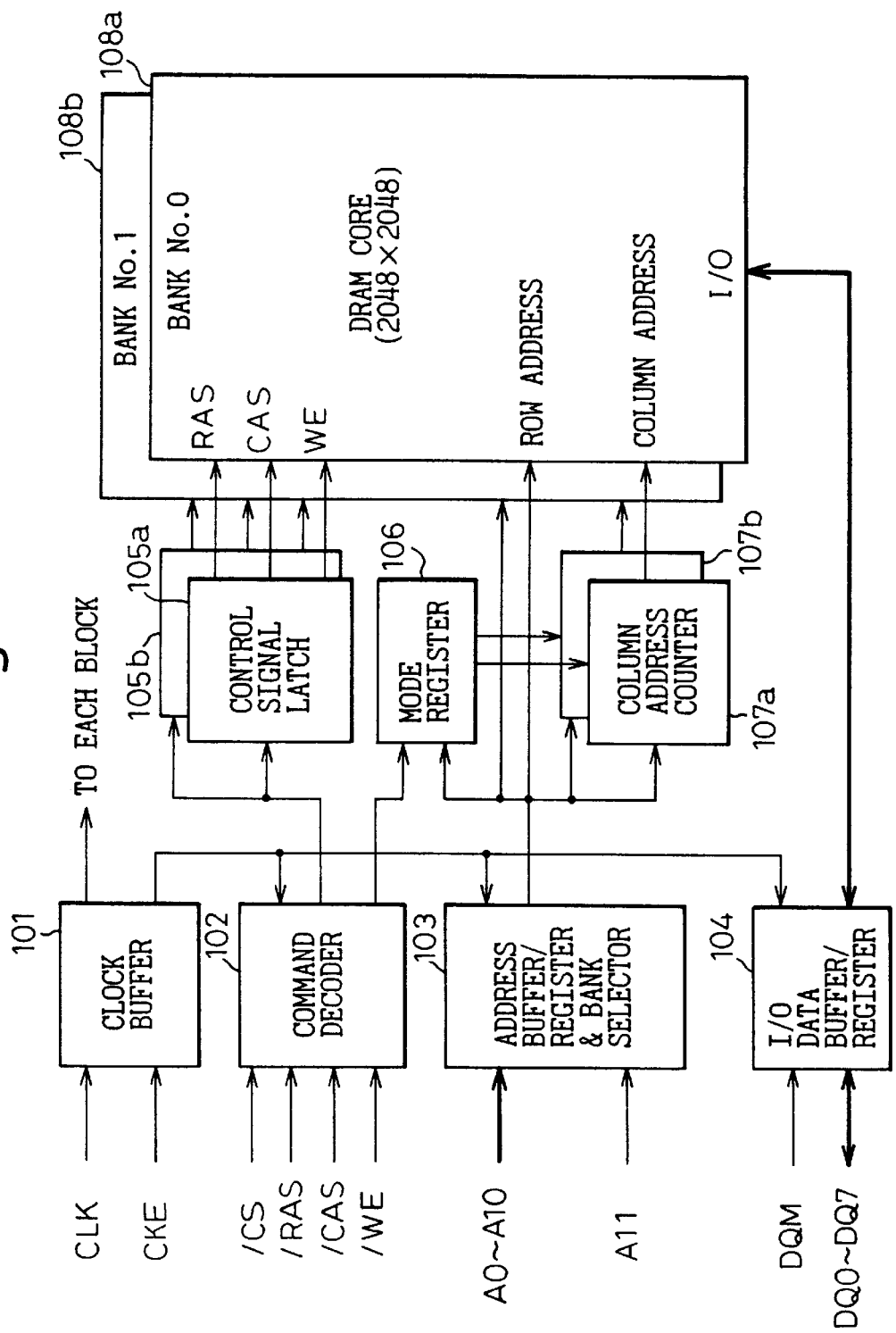

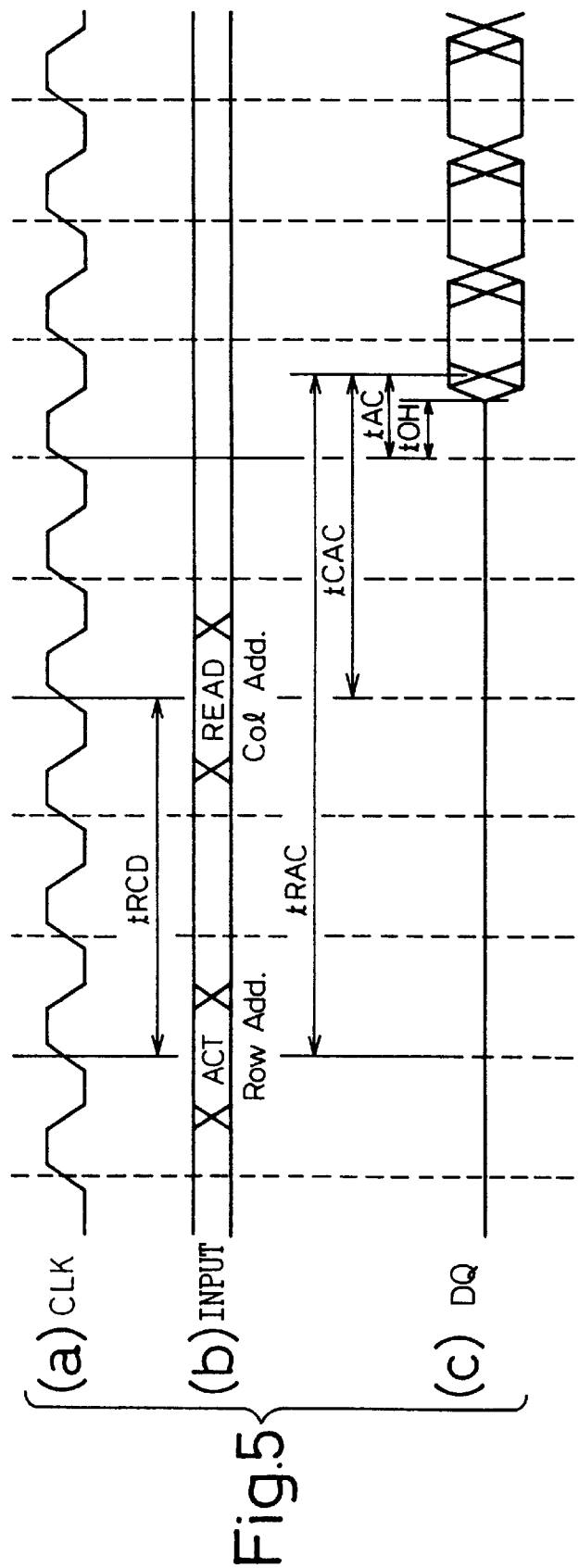

(CLOCK SELECTION ENABLE SIGNAL)
HIGH ← CLOCK FREQUENCY → LOW

SEMICONDUCTOR DEVICE

BACKGROUND OF THE INVENTION

1. Field of the Invention

The present invention relates to a semiconductor device that has a clock phase adjusting circuit such as a delay locked loop (DLL) circuit. The clock phase adjusting circuit adjusts the phase of a clock supplied from an external circuit or the like and produces an internal clock that lags behind the clock by a given phase. More particularly, the present invention is concerned with a semiconductor device having an ability to fetch and output data at a given correct phase irrespective of a dispersion in the characteristics thereof, a change in ambient temperature, a fluctuation in a supply voltage, or the like. For this purpose, the semiconductor device produces an internal clock that lags behind the clock supplied from an external circuit or the like by a given phase of 90° or 120°. Data which is to be input to a high-speed memory or the like represented by a dynamic random access memory (hereinafter abbreviated to a DRAM) is then locked to the internal clock.

2. Description of the Related Art

Normally, a semiconductor chip constructing a semiconductor integrated circuit (LSI) inputs data that is an external input signal, carries out a processing operation in accordance with the input data, and then outputs desired data. In general, as far as a general-purpose LSI is concerned, desired data must be output stably irrespective of a dispersion in the characteristics thereof, a change in ambient temperature, a fluctuation in a supply voltage, or the like. For this purpose, it is important at what timing the external input data should be output. This makes it necessary to define the above timing at advance in the form of a specification. Typically, a DRAM will be taken as an example. A maximum frequency of an address signal as well as the timing in which data is output on the basis of a transition edge of the address signal, a data set-up time required for writing data, and the like, are defined in advance.

In recent years, the frequency of a clock employed in a central processing unit (CPU) in a computer system has become higher and various electronic circuits are operated at a higher speed. A main memory or interface in the CPU are therefore required to operate at a higher speed. Various types of novel DRAMs including a synchronous DRAM (normally abbreviated to an SDRAM) that permits a data transfer rate of, for example, 100 MHz or higher have been proposed.

In a novel DRAM, such as the SDRAM, that operates at high speed, it is necessary to output data in a given accurate phase (for example, 90° or 120°) relative to a clock that is input from an external circuit or the like. Normally, a DLL circuit having an ability to accurately adjust the difference between the phase of an external clock and the phase of an internal clock and produce this internal clock, is incorporated in the DRAM. Data which is to be output from the DRAM is locked to an internal clock produced by the DLL circuit, that is, a DLL clock.

However, some users use the DRAM at relatively low frequencies. In this case, a DLL clock that is a clock produced by the DLL circuit is compared in phase with a real clock that is a clock input to the DRAM. Either one of the DLL clock and the real clock whose phase is leading in comparison with the phase of the other clock is selected and used as an internal clock of a semiconductor device. It is thus avoided that clock access time elapsing from the time when a clock is input until the time when data is output unnecessarily becomes long.

Now, an explanation concerning an exemplary configuration of a conventional semiconductor device, which has an ability to compare the phase of a DLL clock with the phase of a real clock, and also an explanation concerning the operations thereof will be given with reference to FIGS. 1, 2A, and 2B. This will contribute to a better understanding of problems underlying a semiconductor device having an ability to compare the phase of one clock with the phase of another clock according to the prior art. FIGS. 1, 2A, and 2B will be described later in the "Brief Description of the Drawings" section.

The exemplary configuration of a conventional semiconductor device having an ability to compare the phase of one clock with the phase of another clock, which is shown in FIGS. 1, 2A, and 2B, has been disclosed in the specification of the prior patent application filed by the same applicant (Fujitsu Ltd.) as the present application (Japanese Patent Application No. 9-006796 filed on Jan. 17, 1997).

As shown in FIG. 1, the conventional semiconductor device having an ability to compare the phase of one clock with the phase of another clock consists of a DLL circuit 100 including a delay circuit portion (See FIG. 6) for producing a DLL clock DLLCLK by delaying an external clock EXCLK, which is input from an external circuit or the like via an input buffer 500, by a given phase; and a clock phase comparing circuit 150 for comparing the phase of the DLL clock output from the DLL circuit 100 with the phase of a real clock RECLK output from the input buffer 500.

To be more specific, an external clock serving as a reference for enabling a computer system to operate normally is adjusted (e.g., lowered) to a given level by the input buffer 500. Thereafter, the thus adjusted clock is output as a real clock that has undergone a phase delay to some extent. On the other hand, the DLL circuit 100 controls the number of delay stages in the delay circuit portion to preset the amount of delay equivalent to a phase delay of 90° or of 120° relative to the external clock. Furthermore, the clock phase comparing circuit 150 compares the phase of the DLL clock, which is output through the delay stages, with the phase of the real clock output directly from the input buffer 500 without passing through the DLL circuit 100. At this time, the phase of the DLL clock is compared with the phase of the real clock within the cycle of a window pulse signal Sw produced by using a division technique for a frequency of the real clock provided by a division circuit 400. Either one of the above two clocks that is relatively leading is detected as an internal clock for an output signal.

Either one of the DLL clock and the real clock, which has been detected as mentioned above, is supplied to an output buffer 600 in the semiconductor device. The data output buffer 600 fetches data DATA synchronously with either one of the DLL clock and the real clock which is supplied from the clock phase comparing circuit 150. The fetched data is then output as an output signal DOUT to the outside of the semiconductor device.

Furthermore, the way in which the clock phase comparing circuit 150 (FIG. 1) compares the phase of a DLL clock with the phase of a real clock will be described with reference to a timing chart of FIG. 2A. Assuming that a clock frequency (inverse number of a clock cycle tCLK) of an external clock is relatively low, as shown in the timing chart, a clock that lags behind an external clock EXCLK (portion (a) of FIG. 2A) by a given phase (for example, 120°) is used as an internal clock of the semiconductor device. The phase of a DLL clock DLLCLK (portion (c) of FIG. 2A) is compared with the phase of a real clock RECLK (portion (b) of FIG.

2A) within a window that is a cycle of a window pulse signal (hatched portions of FIG. 2A). The window pulse signal is produced by using a division technique of the frequency for the real clock. More particularly, edges (dlos0z and dlos1z) of the clocks occurring within the window are detected and compared with each other. A delay occurring on a clock signal line is included in the delay time td equivalent to a phase delay of the real clock. On the other hand, the DLL clock is leading in anticipation of the delay time td' that may occur in an output circuit, such as the output buffer (as the delay time td' becomes long, the value in which the phase of the DLL clock is leading in comparison with the phase of the real clock increases). The clock phase comparing circuit 150 compares the leading edges (indicated with arrows in the drawing) of the real clock with the leading edges (indicated with arrows in the drawing) of the DLL clock occurring within the window that is the cycle of the window pulse signal. Either one of these two clocks whose leading edge comes earlier than the leading edge of the other clock is detected. In this case (FIG. 2A), the phase of the DLL clock is therefore judged to be leading relative to the phase of the real clock. The DLL clock DLLCLK is output from the clock phase comparing circuit 150. On the other hand, when the leading edge of the real clock comes earlier than the leading edge of the DLL clock, the phase of the real clock is judged to be leading relative to the phase of the DLL clock. The real clock RECLK is output from the clock phase comparing circuit 150. Incidentally, signals dlos0z and dlos1z (corresponding to output signals Sa and Sb, respectively, that will be described later with reference to FIG. 13) are signals produced on the basis of the real clock and of the DLL clock, respectively, for phase comparison (See portions (d) and (e) of FIG. 2A).

As mentioned above, assuming that the clock frequency of an external clock supplied to a semiconductor device is relatively low, and a clock that lags by 90° or 120° is used as a DLL clock, in this case, the phase of a DLL clock produced by a DLL circuit has conventionally been compared with the phase of a real clock that is input to a DRAM. Either one of the above two clocks whose timing comes earlier than the timing of the other clock has been detected and used as an internal clock of the semiconductor device according to the prior art. This is intended to prevent clock access time tAC becoming unnecessarily long.

To be more specific, the DLL circuit adjusts the phase of an internal clock so that a signal will be output from the DRAM synchronously with a clock employed in a computer system. Transmission of a signal within a semiconductor chip is accompanied by a delay. Therefore, the phase of a clock generated by the DLL circuit leads relative to a clock produced outside the semiconductor chip. Actually, the clock generated by the DLL circuit that is leading is produced synchronously with an edge of a given clock of the semiconductor chip which is delayed by the amount of delay corresponding to several cycles of the clock of the semiconductor chip.

Assuming that the clock frequency of an external clock EXCLK (portion (f) of FIG. 2B) shown in a timing chart of FIG. 2B is relatively high, in this case, the phase of a DLL clock DLLCLK (portion (h) of FIG. 2B) is compared with the phase of a real clock (portion (g) of FIG. 2B) within a window that is a cycle of a window pulse signal (hatched portion in the drawing). However, in this condition, the DLL clock tends to deviate from the window by a half cycle. The comparison between the phase of one clock and the phase of another clock may result in a misjudgment that a clock that is leading is regarded as a clock that is lagging.

Specifically, according to the timing chart of FIG. 2B, the clock frequency of an external clock is relatively high and the clock cycle tCLK of the external clock is relatively short in comparison with a delay occurring in a semiconductor device. A leading edge of a DLL clock which is to be compared with a real clock (edge indicated with an arrow in the drawing) rises outside the window. Consequently, although a DLL clock is actually leading relative to a real clock, the DLL clock is judged to lag behind the real clock. As a result, the clock phase comparing circuit does not output the DLL clock DLLCLK (portion (h) of FIG. 2B) that is relatively leading, and outputs a real clock RECLK (portion (g) of FIG. 2B) that is relatively lagging. Thus, a correct judgment is not carried out. Incidentally, signals dlos0z and dlos1z (corresponding to output signals Sa and Sb, respectively, that will be described later with reference to FIG. 13) shown in portions (i) and (j) of FIG. 2B are signals produced on the basis of the real clock and the DLL clock, respectively, for phase comparison.

SUMMARY OF THE INVENTION

The present invention attempts to solve the foregoing problems. An object of the present invention is to provide a semiconductor device capable of accurately detecting a clock that is leading by comparing the phase of a clock produced by a DLL circuit or the like with the phase of a clock that is input to a DRAM or the like. In this case, the clock that is leading can be detected accurately even when the clock frequency of an external clock is relatively high.

To solve the foregoing problems, a semiconductor device in accordance with the present invention includes a clock phase adjusting circuit for adjusting the phase of a first input clock and producing a second clock that lags behind an external clock by a given phase. The semiconductor device output data (output signal) synchronous with either one of the first clock and the second clock.

The thus configured semiconductor device comprises a clock frequency judging unit for judging the frequency of the first clock on the basis of an indication signal indicating a delay value of the first clock in the clock phase adjusting circuit to output a control signal; and a clock selecting unit for selecting either one of the first clock and the second clock, in response to the control signal.

Preferably, in the semiconductor device of the present invention, the clock phase adjusting circuit includes a delay circuit portion. The delay circuit portion has delay stages for delaying the phase of the first clock. The indication signal is a signal indicating the number of delay stages in the delay circuit portion.

More preferably, in the semiconductor device of the present invention, the clock frequency judging unit has hysteresis characteristics. This is intended to prevent (a signal level of) the control signal from varying often depending on an operating environment of the semiconductor device.

More preferably, in the semiconductor device of the present invention, when the control signal indicates that the frequency of the first clock is higher than a predetermined reference value, the clock selecting unit does not compare the phase of the first clock with the phase of the second clock and output the second clock.

On the other hand, the semiconductor device according to a preferred aspect of the present invention comprises a clock phase adjusting circuit to which a first clock is input for producing a second clock that is used as a clock for an output circuit and adjusted so that an output signal from the output circuit can be synchronized with an external clock, by delaying the first clock through a variable delay circuit; a clock frequency judging circuit for judging the frequency of the first clock, on the basis of a delay value of the first clock at the variable delay circuit to output a given control signal; and a clock selection unit for selecting either one of the first clock and the second clock, in response to the given control signal to output a selected signal to an internal circuit.

In the semiconductor device of the present invention, first, a frequency (f1) equivalent to the upper limit of a frequency band for the first clock, within which the phase of one clock is accurately compared with the phase of another clock by a simulation technique, and a frequency (f2) causing the two clocks to be in phase with each other are predetermined. Moreover, the number of required delay stages is also predetermined.

Generally, when the frequency of the first clock (that is, the clock frequency of the external clock) is high, the number of delay stages in the DLL circuit or the like, whose output is locked (e.g., internal clock), is small. When the frequency is low, the number of delay stages is large. The semiconductor device of the present invention makes the most of these characteristics. Based on the number of delay stages, the frequency of the first clock is judged by the clock frequency judging unit. The clock selecting unit is thus controlled. More particularly, the clock frequency judging unit is connected to a node located in a position distanced by the number of delay stages (n3) that is an intermediate value between the number of delay stages (n1) employed at the frequency (f1), and the number of delay stages (n2) employed at the frequency (f2). At this time, an output of some delay stages in the clock phase adjusting circuit realized by a DLL circuit or the like is locked. It is therefore judged whether or not the number of the above delay stages whose output is locked, is larger than the number of delay stages (n3) (f2<f1, n2>n3>n1). It should be noted that the number of delay stages is limited, and therefore it becomes impossible to lock the output of the delay stages when the delay stages is utilized to the fullest.

Assume that the number of delay stages in the clock phase adjusting circuit, whose output is locked, is larger than the number of delay stages (n3). In this case, the clock frequency judging unit outputs an enabling signal (for example, a clock selection enabling signal shown in FIG. 6 that will be described later). This causes the clock selecting unit to operate. The clock selecting unit autonomously selects either one of the first clock and the second clock that is relatively leading. Selecting the first clock or the second clock, or switching the first clock to the second clock or vice versa is therefore carried out smoothly. Even when the frequency of the first clock varies, it is not likely to occur that clock access time (tAC) changes abruptly. On the contrary, the clock access time changes smoothly. Furthermore, assuming that the number of delay stages in the clock phase adjusting circuit, whose output is locked, may become much larger than the number of delay stages (n2), in this case, the clock phase adjusting circuit realized by a DLL circuit or the like is halted. Thus, power consumption required by the operations of the DLL circuit or the like can be minimized.

On the other hand, assume that the number of delay stages in the clock phase adjusting circuit, whose output is locked, may be smaller than the number of delay stages (n1). In this case, since the comparison between the phase of the first clock and the phase of the second clock in the clock selecting unit can not be carried out accurately, an enabling signal will not be supplied from the clock frequency judging unit to the clock selecting unit. The clock selecting unit will therefore not operate. At this time, the second clock produced by the clock phase adjusting circuit is used as an internal clock all the time.

Furthermore, a result of a judgment made concerning the phase of a clock may vary frequently with respect to a change in an operating environment, such as a supply voltage. This means that a clock employed internally by a semiconductor device changes from one clock to another clock frequently. Therefore, a disadvantage may occur in that the semiconductor device per se operates unstably. The clock frequency judging unit is therefore provided with a hysteresis. Consequently, an enabling signal indicating the result of the judgment does not vary very frequently. Thus, the clock employed internally by the semiconductor device is stabilized.

The present invention will be summarized. According to the present invention, even when the clock frequency of an external clock is relatively high, it is judged properly whether or not the phase of a clock produced by a DLL circuit or the like should be compared with the phase of a clock input to a DRAM or the like. A leading clock can thus be selected accurately. On the other hand, when the clock frequency of the external clock becomes low to some extent, the DLL circuit or the like is halted. Power consumption required by the operations of the DLL circuit or the like can thus be minimized. Eventually, one semiconductor chip can deal with a range of clock frequencies much wider than a conventional one.

BRIEF DESCRIPTION OF THE DRAWINGS

The above object and the features of the present invention will be more apparent from the following description of the preferred embodiments with reference to the accompanying drawings, wherein:

FIGS. 2A and 2B are timing charts for explaining problems occurring when the phase of the real clock is compared with the phase of the DLL clock by a conventional semiconductor device;

FIG. 3 is a block diagram showing a configuration of a basic embodiment based on the principle of the present invention;

FIG. 4 is a block diagram showing a schematic configuration of a synchronous DRAM to which a semiconductor device of the present invention is applied;

FIG. 5 is a timing chart for explaining the operations of the synchronous DRAM shown in FIG. 4;

DESCRIPTION OF THE PREFERRED EMBODIMENTS

Referring to the appended drawings (FIGS. 3 to 21), a basic embodiment and preferred embodiments of the present invention will be described below.

FIG. 3 is a block diagram showing a configuration of a basic embodiment based on the principle of the present invention. A configuration of a semiconductor device in accordance with the basic embodiment of the present invention is illustrated schematically.

The semiconductor device in accordance with the basic embodiment of the present invention includes, as shown in FIG. 3, a clock phase adjusting circuit 1 for adjusting the phase of a first input clock CLK1 whose phase is not adjusted in semiconductor device on the basis of a clock (i.e., external clock (EXCLK)) supplied from the outside of the semiconductor device, and producing a second clock CLK2 that lags behind an external clock by a given phase (for example, 90° or 120°). The semiconductor device outputs data DATA (output signal DOUT) synchronous with either one of the first clock and the second clock. However, the second clock CLK2 is, as mentioned previously, leading by a phase corresponding to a delay occurring in an output circuit.

Furthermore, as shown in FIG. 3, the semiconductor device in accordance with the basic embodiment of the present invention comprises a clock frequency judging unit 2 for judging the frequency of the first clock CLK1 on the basis of an indication signal Sd which indicates a delay value of the first clock CLK1 in the clock phase adjusting circuit to output a control signal; and a clock selecting unit 3 for selecting either one of the first clock CLK1 and the second clock CLK2, in response to the control signal.

Preferably, in the semiconductor device in accordance with the basic embodiment of the present invention, the clock phase adjusting circuit 1 includes a delay circuit portion. The delay circuit portion has delay stages for delaying the phase of the first clock. The indication signal Sd is a signal indicating the number of delay stages in the delay circuit portion.

More preferably, in the semiconductor device in accordance with the basic embodiment of the present invention, the clock frequency judging unit 2 has hysteresis characteristics. This is intended to prevent a signal level of the control signal from varying often depending on an operating environment of the semiconductor device.

More preferably, in the semiconductor device in accordance with the basic embodiment of the present invention, when the control signal indicates that the frequency of the first clock CLK1 is higher than a predetermined reference value, the clock selecting unit 3 does not compare the phase of the first clock CLK1 with the phase of the second clock CLK2 and output the second clock CLK2.

Figure 1:
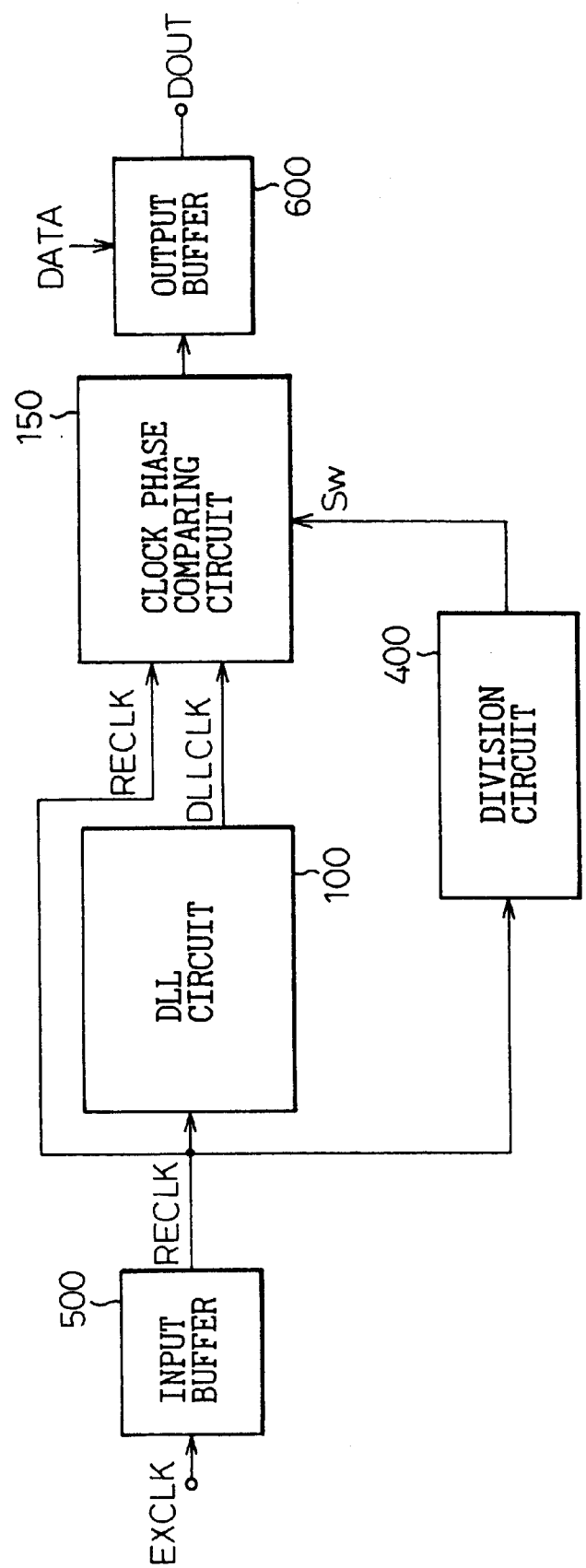
FIG. 1 is a circuit block diagram showing an exemplary configuration of a conventional semiconductor device having an ability to compare the phase of a real clock with the phase of a DLL clock.

In FIG. 3, an input circuit 5 having substantially the same capability as the conventional input buffer 500 (FIG. 1) is located on the input stage of the clock phase adjusting circuit 1. On the output stage of the clock phase adjusting circuit 1, there is an output circuit 6 having substantially the same capability as the conventional output buffer 600 (FIG. 1). An external clock EXCLK serving as a reference for allowing a computer system to operate is lowered to a given level by the input circuit 5, and output as a first clock CLK1. The first clock CLK1 is supplied to the delay circuit portion in the clock phase adjusting circuit 1. Meanwhile, the division of a frequency of the first clock is carried out by a division circuit 4 having substantially the same capability as the conventional division circuit 400. Consequently, a window pulse signal Sw whose cycle is used as a window within which the phase of one clock is compared with the phase of another clock is supplied to the clock selecting unit 3.

To be more specific, in the semiconductor device in accordance with the basic embodiment of the present invention, a frequency f1 and frequency f2 are predetermined. Herein, the frequency f1 is equivalent to the upper limit of a frequency band for the first clock CLK1, within which the phase of one clock is accurately compared with the phase of another clock by a simulation technique (that is, the upper limit of a frequency band within which the first clock has the phase difference relative to the second clock corresponding to a half of a clock cycle tCLK of the external clock shown in portion (1) of FIG. 2B (tCLK/2=window) or more than a half of this clock cycle. The frequency f2 corresponds to the frequency causing the two clocks to become almost in phase with each other. Besides, the number of delay stages is predetermined.

In general, when the frequency of the first clock CLK1 is high (that is, the clock frequency of the external clock is high), the number of delay stages in a DLL circuit or the like, whose output is locked, is small. When the frequency of the first clock CLK1 is low, the number of delay stages is large. The basic embodiment shown in FIG. 3 makes the most of these characteristics. Based on the number of delay stages, the clock frequency judging unit 2 judges the frequency of a clock CLK. The clock selecting unit 3 is thus controlled. Specifically, the clock frequency judging unit 2 is connected to a node located at a position distanced by the number of delay stages n3. Herein, the number of delay stages n3 is an intermediate value between the number of delay stages n1 employed at the frequency f1 and the number of delay stages n2 employed at the frequency f2. It is judged whether or not the number of the above delay stages in the clock phase adjusting circuit 1 realized by a DLL circuit or the like, whose output is locked, is larger than the number of delay stages n3 (f2<f1, n2>n3>n1). It should be noted that the number of delay stages is limited, and therefore it becomes impossible to lock the output of the delay stages when the delay stages is utilized to the fullest.

Assume that the number of delay stages in the clock phase adjusting circuit 1, whose output is locked, is larger than the number of delay stages n3. In this case, an enabling signal Se (for example, a clock selection enabling signal CLKSEN shown in FIG. 6 that will be described later) is output from the clock frequency judging unit 2. This causes the clock selecting unit 3 to operate. The clock selecting unit 3 autonomously selects either one of the first clock and the second clock that is relatively leading. Selecting the first clock CLK1 or the second clock CLK2, or switching the first clock to the second clock or vise versa is thus carried out smoothly. Even when the frequency of the first clock CLK1 varies, a clock access time tAC will not change abruptly but will change smoothly. Furthermore, assuming that the number of delay stages in the clock phase adjusting circuit 1, whose output is locked onto a reference signal, may be much larger than the number of delay stages n2, in this case, the clock phase adjusting circuit 1 realized by a DLL circuit or the like is halted. Power consumption required by the operations of the DLL circuit or the like is thus minimized.

On the other hand, assume that the number of delay stages in the clock phase adjusting circuit 1, whose output is locked, is smaller than the number of delay stages n1. In this case, since the comparison between the phase of the first clock and the phase of the second clock in the clock selecting unit 3 (e.g., a clock selecting circuit 30 shown in FIG. 6 that will be described later) can not be carried out accurately, the enabling signal Se will therefore not be supplied from the clock frequency judging unit 2 to the clock selecting unit 3. The clock selecting unit 3 will not operate. At this time, the second clock CLK2 produced by the clock phase adjusting circuit 1 is used as an internal clock all the time.

Furthermore, a result of a judgment made concerning the phase of a clock may vary frequency with respect to a change in an operating environment, such as a supply voltage. This means that a clock employed internally by a semiconductor device changes from one clock to another clock frequently. Therefore, a disadvantage may occur in that the semiconductor device per se operates unstably. The clock frequency judging unit 2 is therefore provided with a hysteresis. This prevents the enabling signal Se indicating the result of the judgment from varying frequently. Eventually, the clock employed internally by the semiconductor device is stabilized.

In the semiconductor device in accordance with the basic embodiment of the present invention, even when the clock frequency of an external clock is relatively high, whether or not the phase of a clock produced by a DLL circuit or the like is compared with the phase of a clock input to a DRAM or the like, can be judged properly. A clock that is leading can therefore be selected accurately. In contrast, assuming that the clock frequency of the external clock becomes low to some extent, in this case, the DLL circuit or the like is halted. Power consumption required by the operations of the DLL circuit or the like can thus be minimized. Eventually, one semiconductor chip can deal with a range of clock frequencies much wider than a conventional one.

Incidentally, a configuration and operations of an SDRAM to which the embodiments of the present invention is applied will be described with reference to FIGS. 4 and 5. This will contribute to a better understanding of the configurations and features of the preferred embodiments of the present invention that will be described later.

FIG. 4 is a block diagram showing a schematic configuration of a synchronous DRAM to which a semiconductor device of the present invention is applied. FIG. 5 is a timing chart for explaining the operations of the synchronous DRAM shown in FIG. 4. In this case, only one example of various conventional synchronous DRAMs will be illustrated.

A semiconductor chip having the synchronous DRAM (SDRAM) shown in FIG. 4 consists of DRAM cores 108a and 108b that is realized by a plurality of banks (for example, bank No. 0 and bank No. 1) that define memory areas in the chip, and sized to offer a storage capacity of 2048 bits by 2048 bits; control signal latches 105a and 105b for holding various kinds of control signals to be supplied to the DRAM cores 108a and 108b (a row address strobe signal RAS, column address strobe signal CAS, and write enabling signal WE for the DRAM cores); a mode register 106 for specifying an operation mode of the SDRAM; and column address counters 107a and 107b for counting pulses to indicate a column address and enabling access to data.

The semiconductor chip shown in FIG. 4 further consists of a clock buffer 101 for holding a clock CLK (for example, the aforesaid external clock EXCLK) serving as a reference for allowing the synchronous DRAM to operate based on a clock enabling signal CKE, and supplying the clock CLK to any other circuit portion; a command decoder 102 for decoding various kinds of command signals (a chip selection signal /CS, row address strobe signal /RAS, column address strobe signal /CAS, and write enabling signal /WE), and supplying resultant signals to the control signal latches 105a and 105b and mode register 106; an address buffer/register and bank selector 103 for holding memory address signals A0 to A10 indicating row addresses and column addresses and a bank address signal A11, and supplying them to the mode register 106, column address counters 107a and 107b, and DRAM cores 108a and 108b; and an I/O data buffer/register 104 for holding various kinds of data DQ (DQ0 to DQ7 and DQM) and supplying them to I/O units of the DRAM cores.

In FIG. 4, the command signals, such as the chip select signal /CS, row address strobe signal /RAS, column address strobe signal /CAS, and write enabling signal /WE, are combined to provide various kinds of commands. Consequently, an operation mode is determined. The various kinds of commands are decoded by the command decoder 102. The circuits are controlled in accordance with the operation mode determined with the commands. The chip selection signal /CS, row address strobe signal /RAS, column address strobe signal /CAS, and write enabling signal /WE are also input to the control signal latches 105a and 105b. The current states of the command signals are latched until the next command signals are input.

In FIG. 4, the memory address signals A0 to A10, and the bank address signal A11 are lowered by the address buffer/register and bank selector 103 and used to provide row addresses in the banks. Moreover, the address signals are used to provide initial values for the column address counters 107a and 107b. Signals read from the DRAM cores 108a and 108b are amplified by the I/O data buffer/register 104, and output synchronously with a leading edge of an externally input clock CLK. Similar operations are carried out for an input of data. Data that is input to the I/O data buffer/register 104 is written in the DRAM cores 108a and 108b.

Various kinds of control signals are input to a DRAM core synchronously with a leading edge of the clock CLK shown in portion (a) of the timing chart of FIG. 5 (shown in portion (b)). Data is read from the DRAM core. In this case, first, a row address of a memory matrix in the DRAM core is selected. After the given delay time (corresponding to row address access time tRCD to be described later) elapses, a column address is selected. A data read operation is then started.

To be more specific, for reading data from the SDRAM, an activation (ACT) command specified by a combination of the various kinds of command signals is input through a command terminal. A row address signal is input through an address terminal. When the command and row address are input, the SDRAM is activated to select a word line specified with the row address. Cell information concerning cells on the selected word line is output on bit lines, and then amplified by sense amplifiers. After an operation time required for accessing the row address (row address access time tRCD) elapses, a read command (READ) and column address are input. Data amplified by a sense amplifier associated with the selected column address is output on a data bus, and then amplified by a data bus amplifier. The data is further amplified by an output buffer. Consequently, data DQ is output through an output terminal (shown in portion (c)).

The series of operations is identical to that of a general-purpose DRAM. In the case of the SDRAM, however, a circuit concerned with a column address is constructed to carry out pipeline operations. Data that has been read out is output continuously during each cycle. A cycle of data transfer becomes equal to the cycle of the clock CLK, such as an external clock.

With regard to an SDRAM, three types of access times are defined on the basis of the leading edge of the clock CLK. In FIG. 5, tPAC denotes row address strobe signal access time (RAS access time) representing the time which has elapsed from the generation of the row address strobe signal /RAS until the output of data. tCAC denotes column address strobe signal access time (CAS access time) representing the time which has elapsed from the generation of the column address strobe signal /CAS until the output of data. tAC denotes clock access time representing a time lag between the timing of the leading edge of the clock CLK and the timing of the output of data. When the SDRAM is employed in a high-speed memory system, the access times tRAC and tCAC representing the times required for acquiring data first after the input of command signals are important. For improving a data transfer rate, the clock access time tAC is also important. One reason for this is that, when clock access time tAC is lagging, available portions in the output data become smaller and therefore, it becomes difficult to stably carry out operations such as the set-up operation of an external circuit e.g., CPU, and the hold operation. Another reason for this is that the output of data cannot become certain at the edge of the next clock.

Furthermore, in FIG. 5, tOH denotes an output data holding time for succeeding a previous cycle or preceding a subsequent cycle. In consideration of a dispersion in characteristics of the SDRAM, temperature dependency of the SDRAM, and supply voltage dependency of the SDRAM, both the clock access time tAC and the output data holding time tOH changes, and there is a certain time width between the clock access time and the output data holding time. During the time period equivalent to the above time width, data which is to be output through an output terminal is uncertain. When data is uncertain, that is, during data uncertainty time, it is unknown what kind of data is output. A memory system cannot be used during the data uncertainty time.

The data uncertainty time tends to change with respect to an uncertainty in characteristics of an SDRAM, a temperature change, and a fluctuation in supply voltage. Even in this case, data must be output without an error in accordance with the correct timing. It is therefore required that data is output at a given phase relative to a clock CLK, that is, the clock access time tAC is always constant. For example, it may be preferable that data is output synchronously with the leading edge of an internal clock. In this case, the number of delay stages in the delay circuit portion of the clock phase adjusting circuit (See FIG. 3) must be set so that the phase difference between a clock CLK such as an external clock and the internal clock will be retained at a given value, for example, 90° or 120°.

Figure 6:
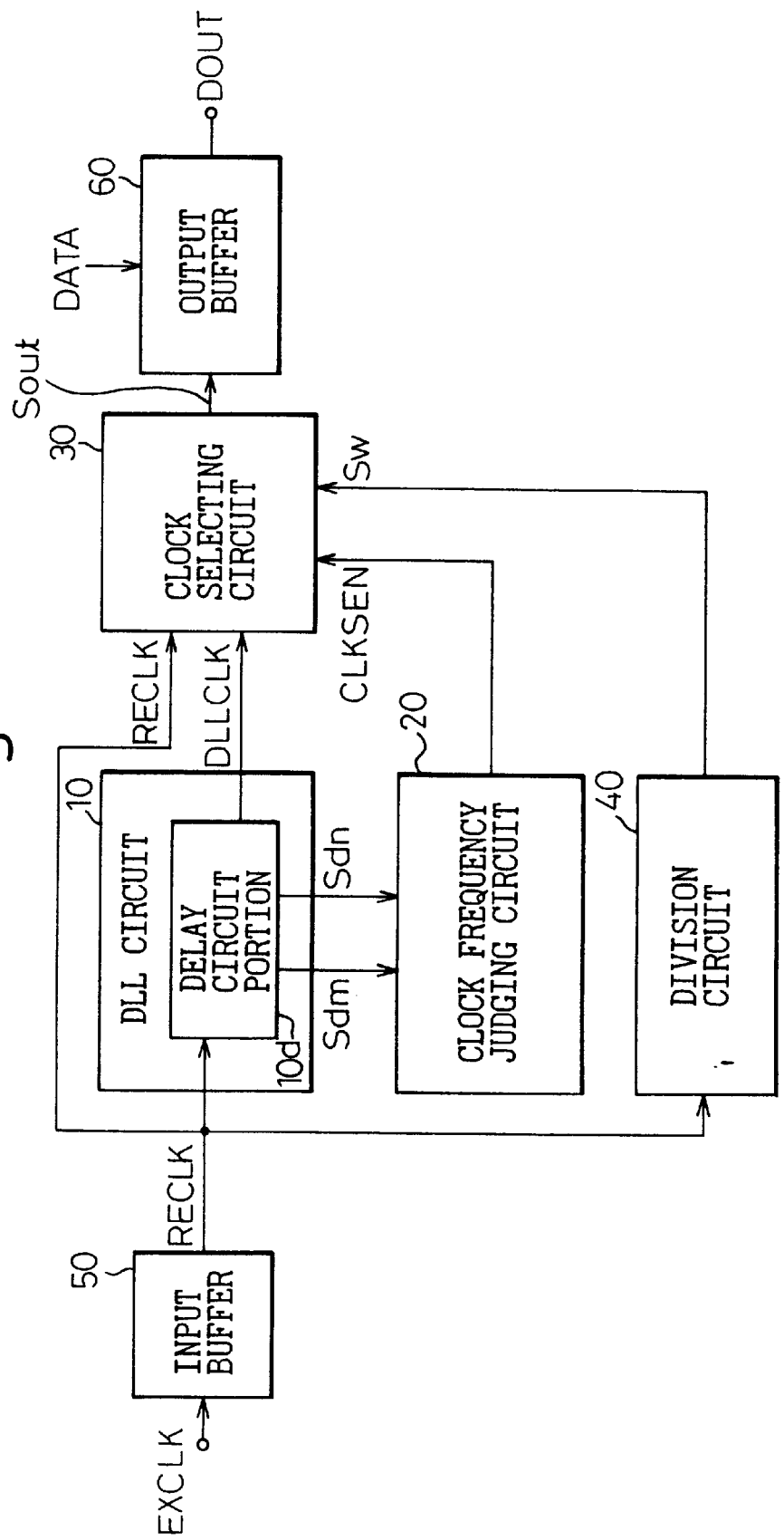
FIG. 6 is a circuit block diagram showing a configuration of a conceptual embodiment of the present invention.
Figure 7:
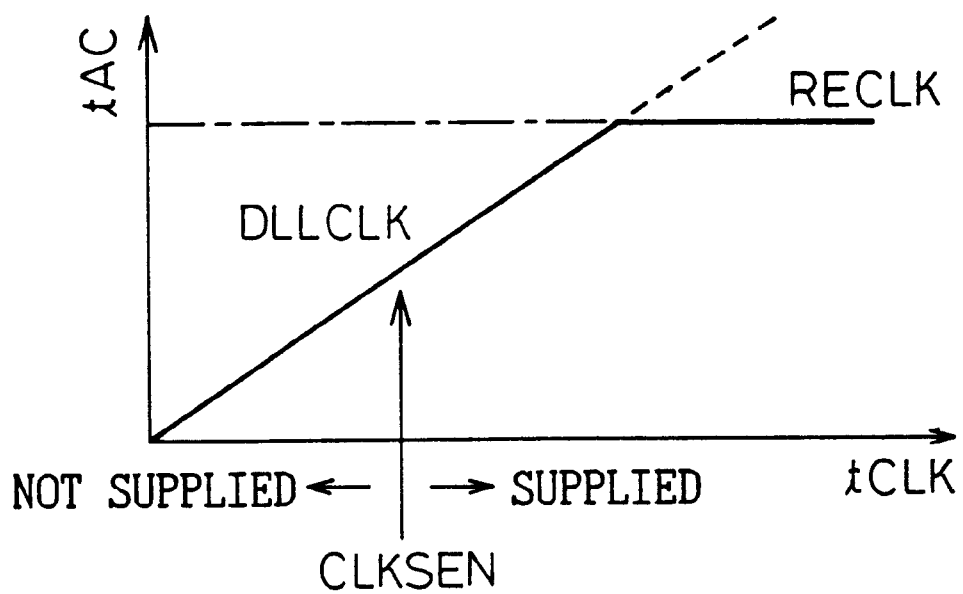
FIG. 7 is a graph showing the relationship between a clock frequency and clock access time to which operations of the semiconductor device of this embodiment are added.

FIG. 6 is a circuit block diagram showing a configuration of a conceptual embodiment of the present invention. FIG. 7 is a graph showing the relationship between a clock frequency and the clock access time to which operations of the semiconductor device of this embodiment are added. The graph shown in FIG. 7 represents a performance of an SDPAM by using a line representing the relationship between the clock frequency (tCLK) and the clock access time tAC. Further, the description as to which clock a circuit of the semiconductor device of the present invention should be selected is added to the above line in FIG. 7. Hereinafter, the same reference numerals will be assigned to components identical to those described previously.

In the conceptual embodiment shown in FIG. 6, a DLL circuit 10 is included. The DLL circuit 10 adjusts the amount of delay (phase) of an external clock EXCLK that is supplied from an external circuit or the like. In the DLL circuit 10, when data is finally output as the output signal DOUT, a DLL clock DLLCLK (corresponding to the second clock CLK2 in FIG. 3) that always lags behind the external clock by a given phase (for example, 90°, 120° or the like) is output, taking into consideration some delay in an output buffer 60.

The DLL circuit 10 includes a delay circuit portion 10d having delay stages for producing a DLL clock that lags behind the external clock, which is input from an external circuit or the like, via an input buffer 50, by a given phase. The input buffer 50 disposed in the input stage of the DLL circuit 10 has substantially the same capability as the conventional input buffer 500 (FIG. 1). A real clock RECLK equivalent to the first clock CLK1 (FIG. 3) which is the object of phase comparison is output from the input buffer 50. In this case, the real clock is supplied to the delay circuit portion of the DLL circuit 10. Meanwhile, the division of a frequency of the real clock is carried out by a division circuit 40 having substantially the same capability as the conventional division circuit 400. A resultant signal is supplied as a window pulse signal Sw that is used as a window within which the phase of one clock is compared with the phase of another clock, to a clock selecting circuit 30 to be described later.

Furthermore, in FIG. 6, a clock frequency judging circuit 20 is included as the clock frequency judging unit 2 (FIG. 3) in accordance with the present invention. The clock frequency judging circuit 20 judges on the basis of delay stage signals (Sdm and Sdn) which are output from nodes of a shift register, whether or not the number of the above delay stages is larger than a predetermined value. Herein, the shift register controls the number of delay stages in the delay circuit portion 10d. The clock frequency judging circuit 20 detects the number of delay stages in the DLL circuit 10 whose output is locked onto a reference signal. The clock frequency judging circuit 20 thus judges whether or not the frequency of the real clock is higher than a predetermined reference value, and outputs an enabling signal, such as a clock selection enabling signal CLKSEN.

In FIG. 6, a clock selecting circuit 30 is included as the clock selecting unit 3 (FIG. 3) in accordance with the present invention. The clock selecting circuit 30 compares the phase of the real clock with the phase of the DLL clock and selects a clock, which is leading, as a clock with which data DATA is synchronized. Whether or not the clock selecting circuit 30 is used to compare the phase of one clock with the phase of another clock, is determined based on a result of a judgment made by the clock frequency judging circuit 20, that is, the clock selection enabling signal CLKSEN. To be more specific, when the frequency of the real clock is judged higher than the predetermined reference value, the clock selecting circuit 30 will not be used to compare the phase of the real clock with the phase of the DLL clock. The data DATA is synchronized with the DLL clock (or the DLL clock is used as a clock for outputting data). A selection clock signal Sout output from the clock selecting circuit 30 is a signal corresponding to either one of the real clock and the DLL clock.

Furthermore, in FIG. 6, an output buffer 60 having substantially the same capability as the conventional output buffer 600 (FIG. 1) is disposed in the output stage of the semiconductor device such as SDRAM. The output buffer 60 fetches the data DATA synchronously with either one of the real clock and DLL clock supplied from the clock selecting circuit 30, and outputs the same as an output signal DOUT.

To be more specific, in the conceptual embodiment, for example, a simulation is carried out. Thus, the number of delay stages n1 corresponding to a frequency f1 that is equivalent to the upper limit of a frequency band, within which the phase of the real clock is compared with the phase of the DLL clock, and the number of delay stages n2 corresponding to a frequency f2 at which the above two clocks are substantially in phase with each other, are calculated in advance (f2<f1, n2>n1). Furthermore, assume that two arbitrary numbers of delay stages m and n (m<n) are intermediate values between the numbers of delay stages n1 and n2. In this case, delay stage signals Sdm and Sdn are output from two nodes located in positions which respectively correspond to the two arbitrary numbers of delay stages m and n and are distanced by these two numbers. The delay stage signals Sdm and Sdn are input to the clock frequency judging circuit 20. The clock frequency judging circuit 20 checks the output level of one of the delay stage signals Sdm and Sdn, for example, the delay stage signal Sdn. The clock frequency judging circuit 20 then detects whether or not the number of delay stages in the DLL circuit 10, whose output is locked, is larger than the number of delay stages n. If the number of delay stages in the delay circuit portion 10d is larger than the number of delay stages n, the clock frequency (inverse number of the clock cycle tCLK) of the external clock is judged lower than the predetermined reference value. A clock selection enabling signal CLKSEN is output from the clock frequency judging circuit 20.

The clock selection enabling signal CLKSEN output from the clock frequency judging circuit 20 is supplied to the clock selecting circuit 30. This causes the clock selecting circuit 30 to operate. In this case, as shown in FIG. 7, the clock selecting circuit 30 autonomously selects a clock that is relatively leading. It is carried out smoothly to select the real clock or DLL clock or switch the real clock to the DLL clock or vice versa. Even when the frequency of the real clock, that is, the clock frequency of the external clock varies, clock access time tAC will not change abruptly but will change smoothly. Furthermore, the number of delay stages in the DLL circuit 10 whose output is locked, may become much larger than the number of delay stages n2. In this case, the DLL circuit is halted. Thus, power consumption required by the unnecessary operations of the DLL circuit can be minimized.

In contrast, assuming that the number of delay stages in the DLL circuit 10 whose output is locked, is smaller than the number of delay stages n, the clock frequency of the external clock is judged higher than a predetermined reference value. A clock selection enabling signal CLKSEN will not be supplied to the clock selecting circuit 30. Consequently, the clock selecting circuit 30 halts. At this time, as shown in the left-hand portion of FIG. 7, a DLL clock, i.e., a clock produced by the DLL circuit 10 is used as an internal clock.

Furthermore, in the conceptual embodiment, if a result of a judgment made concerning the phase of a clock by the clock selecting circuit 30 varies frequently with respect to a change in an operating environment, such as a supply voltage, an internal clock employed in the semiconductor device changes from one clock to another clock frequently. There is some fear that the semiconductor device per se may operate unstably. To avoid this disadvantage, the clock frequency judging circuit 20 is provided with a hysteresis. A clock selection enabling signal CLKSEN indicating the result of the judgment is thus prevented from varying easily. Consequently, the internal clock is stabilized.

To be more specific, as mentioned previously, the delay stage signals Sdm and Sdn are output from two nodes in a shift register or the like for controlling the number of delay stages in the DLL circuit 10. Herein, the two nodes are located in positions distanced by two arbitrary numbers of delay stages m and n respectively. The two arbitrary numbers of delay stages m and n are intermediate values between the numbers of delay stages n1 and n2. Herein, the output level of the delay stage signal Sdn, which is output from the node located in the position corresponding to the number of delay stages n, is checked. The output level may demonstrate that the number of delay stages in the DLL circuit 10 increases and becomes larger than the number of delay stages n. In this case, even if the number of delay stages in the DLL circuit 10 becomes smaller than the number of delay stages n, the clock selection enabling signal CLKSEN is still output. Furthermore, the output level of the delay stage signal Sdm, which is output from the node located in the position corresponding to the number of delay stages m, is checked. The output level may demonstrate that the number of delay stages in the DLL circuit 10 becomes smaller than the number of delay stages m. At this time, the output of the clock selection enabling signal CLKSEN is halted. Namely, the two delay stage signals Sdm and Sdn output from the two nodes are utilized to stabilize the supply of the clock selection enabling signal CLKSEN to the clock selecting circuit 30.

According to the conceptual embodiment, even when the clock frequency of an external clock is relatively high, it is judged properly whether or not the phase of a DLL clock produced by a DLL circuit should be compared with the phase of a real clock input to a semiconductor device, such as a DRAM. A clock that is leading can therefore be selected accurately. The semiconductor device can deal with the remarkably wide range of clock frequencies that are relatively high.

A configuration of the DLL circuit 10 related to the present invention will be described. The configuration of the DLL circuit 10 described below falls within the scope of the prior art. The configuration will therefore be described briefly.

Figure 8:
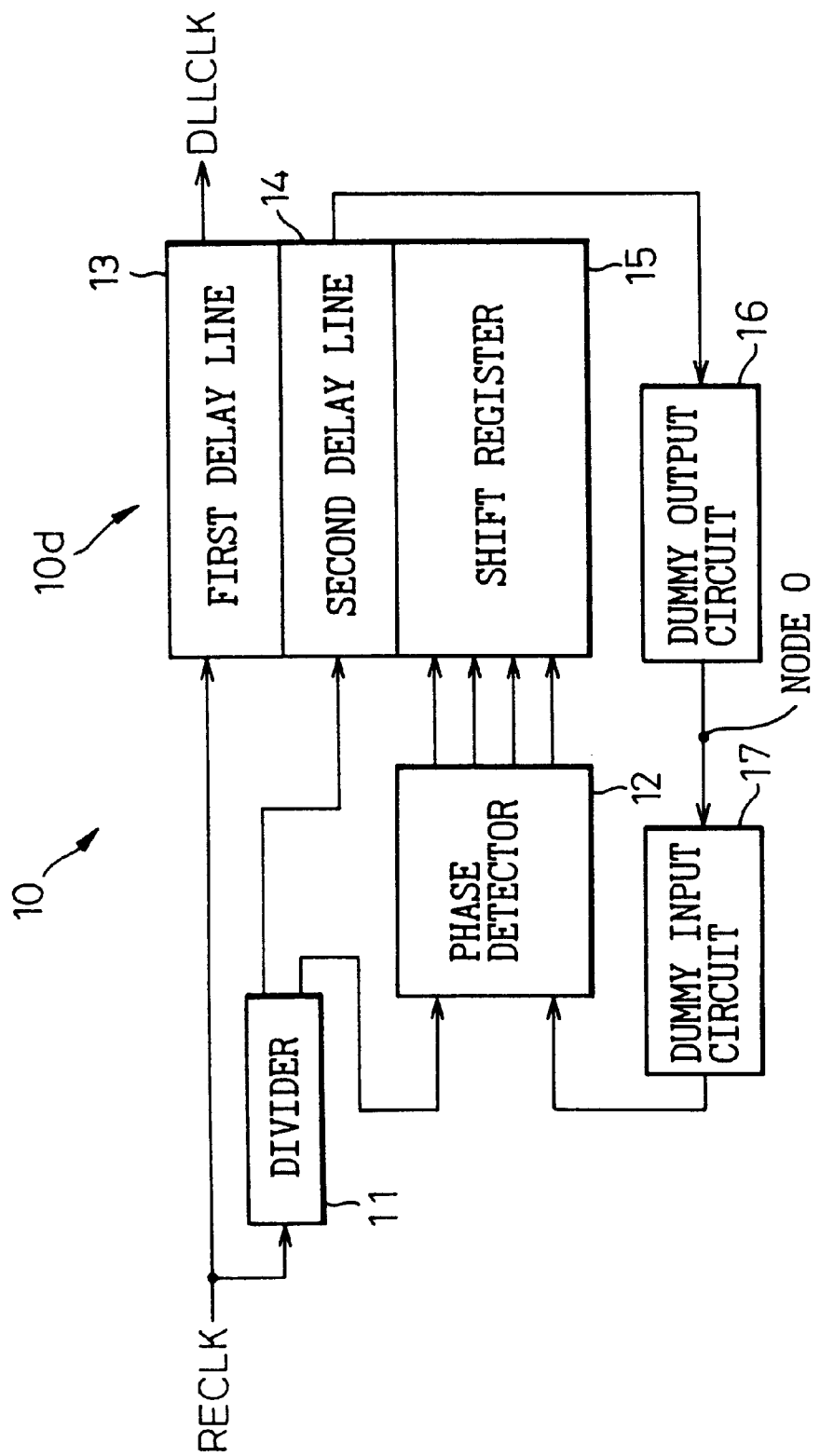
FIG. 8 is a circuit block diagram showing a practical exemplary configuration of a DLL circuit in the embodiment shown in FIG. 6.

FIG. 8 is a circuit block diagram showing a practical exemplary configuration of a DLL circuit of the embodiment shown in FIG. 6.

In FIG. 8, a DLL circuit 10 consists of a divider 11 for dividing a frequency of a real clock; a phase detector 12 for comparing the phase of a division clock signal output from the divider 11 with the phase of a delayed division clock signal produced by delaying the division clock signal output from the divider 11 by a given phase; a first delay line 13 having delay stages for delaying the real clock by the given phase to produce a DLL clock; a second delay line 14 having delay stages for delaying the division clock signal output from the divider 11 by a given phase, and supplying a resultant signal to the phase detector 12; and a shift register 15 for controlling the number of delay stages in the DLL circuit 10. The first and second delay lines 13 and 14, and shift register 15 constitute a delay circuit portion 10d.

Furthermore, a dummy output circuit 16 is located in the output stage of the second delay line 14. The dummy output circuit 16 produces the same amount of delay as that produced by an output circuit, such as the output buffer shown in FIG. 6. Moreover, a dummy input circuit 17 is interposed between the dummy output circuit 16 and phase detector 12. The dummy input circuit 17 produces the same amount of delay as that produced by an input circuit, such as the input buffer shown in FIG. 6.

Assume that there is a path linking the divider 11, second delay line 14, dummy output buffer 16, and dummy input buffer 17 in the order of these components. A signal at a node 0 in FIG. 8 by way of the above path is in phase with an output signal DOUT (data DATA) output from an output circuit. Now, the amount of delay of an external clock which is to be produced by each of the input circuit and dummy input buffer 17, shall be td1. The amount of delay of the external clock which is to be produced by each of the first delay line 13 and second delay line 14, shall be td2. The amount of delay of the external clock which is to be produced by each of the output circuit and dummy output buffer 16, shall be td3. The shift register 15 adjusts the amount of delay td2 to meet the condition described below.

$$td1+td2+td3=n \times tCLK$$

where n denotes a positive integer equal to or larger than 1. Consequently, the external clock EXCLK and output signal DOUT (data DATA) become synchronous with each other.

To be more specific, in FIG. 8, an externally supplied real clock is input to each of the divider 11 and first delay line 13. The divider 11 produces a division clock signal whose frequency is a given fraction of the frequency of the real clock. The thus produced division clock signal is supplied to the phase detector 12 and second delay line 14. The second delay line 14 delays the division clock signal by the amount of delay (td2) in accordance with the setting of the shift register 15, and outputs a delayed division clock signal. The delayed division clock signal output from the second delay line 14 is input to the phase detector 12 via the dummy output circuit 16 and dummy input circuit 17.

In FIG. 8, the phase detector 12 compares the phase of the division clock signal sent from the divider 11 with the phase of the delayed division clock signal sent from the second delay line 14. More specifically, the phase detector 12 detects whether or not the phase difference between the division clock signal and the delayed division clock signal falls within the given range. In other words, the phase detector 12 detects whether or not the phase difference exceeds the given range, and also detects whether the division clock signal leads beyond the given range or lags behind the delayed division clock signal beyond the given range. Based on a result of detection carried out by the phase detector 12, the phase detector 12 transmits a control signal to the shift register 15. The amount of delay produced by the second delay line 14 is then adjusted in accordance with the control signal.

Based on the control signal sent from the phase detector 12, the setting of the shift register 15 is controlled. According to the setting of the shift register 15, the amount of delay (number of delay stages) produced by the first delay line and second delay line are determined concurrently. When the phase difference between the division clock signal and delayed division clock falls within the given range, the setting of the shift register 15 will not be modified. When the phase difference exceeds the given range and the division clock signal leads, or when the phase difference exceeds the given range and the division clock signal lags behind the delayed division clock signal, the setting of the shift register 15 is modified. The amount of delay produced by each the first delay line 13 and second delay line 14 is adjusted concurrently so that the phase difference will fall within the given range.

In other words, the first delay line 13 delays the real clock by the same amount of delay as the second delay in accordance with the setting of the shift register 15. This causes the first delay line 13 to output an internal clock (for example, a DLL clock) that lags behind the real clock by the given delay time.

Figure 9:
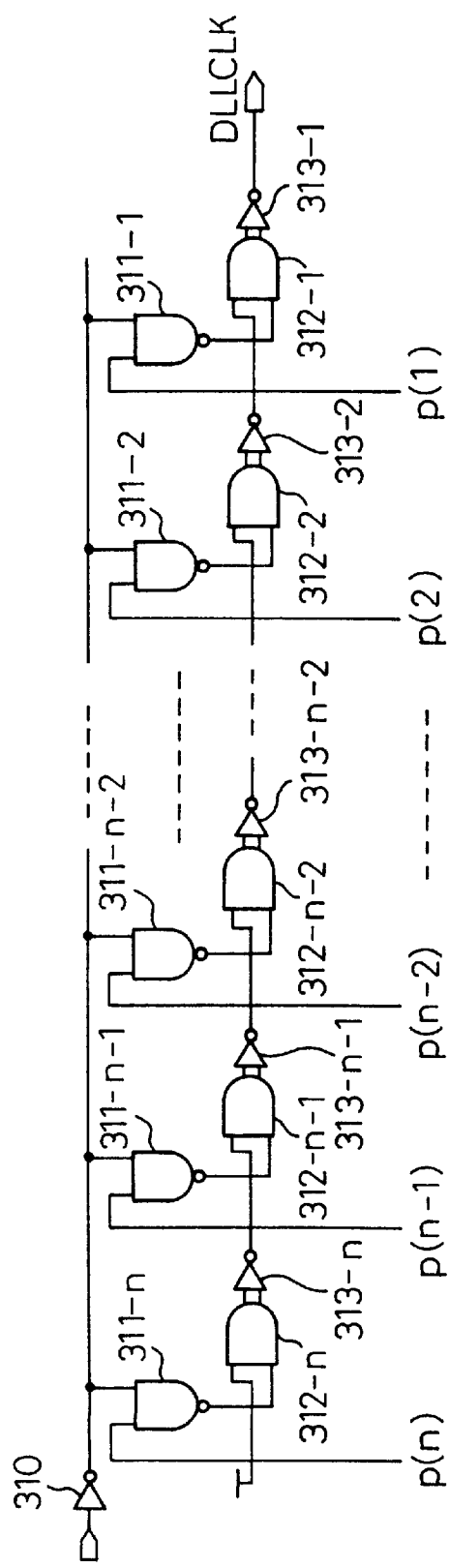
FIG. 9 is a circuit diagram showing an exemplary configuration of a delay line included in the DLL circuit shown in FIG. 8.

FIG. 9 is a circuit diagram showing an exemplary configuration of a delay line included in the DLL circuit shown in FIG. 8. Typically, the delay line having the configuration shown in FIG. 9 is used as the first delay line 13 and second delay line 14 (FIG. 8).

The delay line shown in FIG. 9 includes an inverter 310, NAND gates 311-1 to 311-n, NAND gates 312-1 to 312-n, and inverters 313-1 to 313-n. In this configuration, the inverter 310 receives an input signal and the inverter 313-1 sends an output signal.

The NAND gates 311-1 to 311-n receive signals p(1) to p(n) through one input terminal thereof. The NAND gates 311-1 to 311-n receive a common input signal from the inverter 310 through the other input terminals thereof. One of the signals p(1) to p(n) is high ("H": i.e., one of these signals has a high output level), and the remaining signals are low ("L": i.e., each of the remaining signals have a low output level). Outputs of the NAND gates 311-1 to 311-n are supplied to one input terminals of the NAND gates 312-1 to 312-n, respectively. Outputs of the NAND gates 312-2 to 312-n are supplied to the other input terminals of the NAND gates 312-1 to 312-n-1 situated in the next stage via the inverters 313-2 to 313-n, respectively. The voltage level of other input terminal of the NAND gate 312-n is fixed to the high level ("H"). An output of the NAND gate 312-1 is transmitted as an output signal via the inverter 313-1.

Assume that one of the signals p(1) to p(n) that is high ("H") is a signal p(m). A NAND gate 311-m for receiving the signal p(m) in one input terminal operates as an inverter for inverting a signal input to the other input terminal. An input signal sent to the delay line is inverted twice by the inverter 310 and the above inverter that is actually the NAND gate 311-m. A resultant signal is input as an original input signal to a NAND gate 312-m. Now, the NAND gates 311-1 to 311-n except for the NAND gate 311-m shall be regarded as a NAND gate 311-y. Since an input signal p(y) associated with the NAND gate 311-y is low ("L"), an output of the NAND gate 311-y is always high ("H"). A NAND gate 312-y therefore operates as an inverter. The NAND gate 312-y and the associated inverter 313-y are paired to constitute a delay element.

The voltage level of one input terminal of the NAND gate 312-n is fixed to the high level ("H"), and the voltage level of one input terminal of the NAND gate 312-m is also fixed to the high level ("H"). The NAND gage 312-m therefore operates as an inverter for inverting an input signal sent to the delay line. The input signal sent to the delay line passes through the inverter that is the NAND gage 312-m and the inverter 313-m. The input signal further passes through the delay element located at the downstream side. Finally, the input signal is transmitted as an output signal from the inverter 313-1. In short, the amount of delay of an output signal varies depending on the output position of the signal p(m) of high level ("H"). If the output position of the signal p(m) is close to the upstream side (that is, the value of "m" is large), the amount of delay is large. If the output position of the signal p(m) is close to the downstream side (that is, the value of "m" is small), the amount of delay is small.

Figure 10:
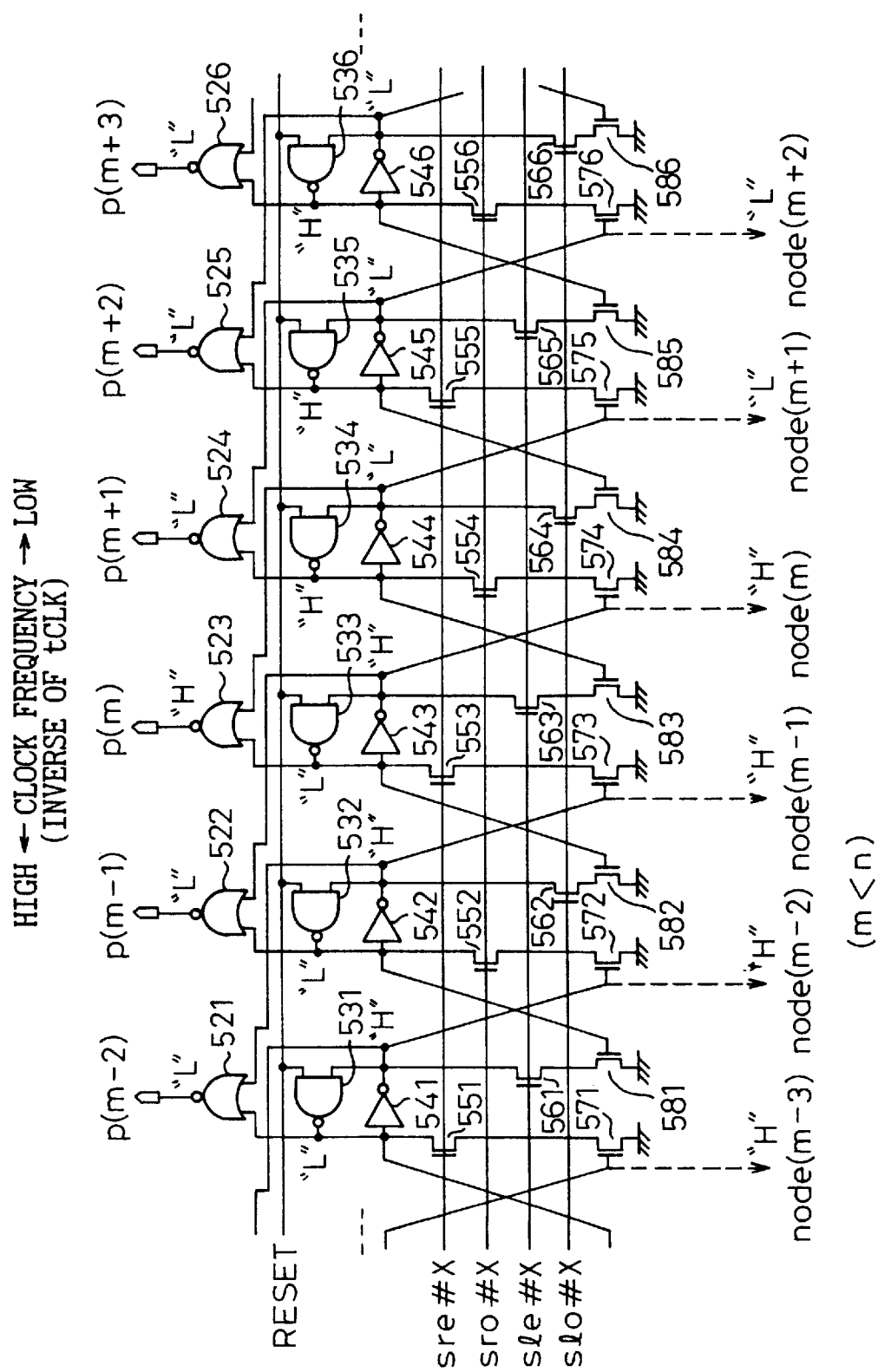
FIG. 10 is a circuit diagram showing an exemplary configuration of a shift register included in the DLL circuit shown in FIG. 8.

FIG. 10 is a circuit diagram showing an exemplary configuration of a shift register included in the DLL circuit shown in FIG. 8. FIG. 10 shows an example of the shift register 15 (FIG. 6) having an ability to produce signals p(1) to p(n). Shown is a practical circuit for treating six signals p(m−2) to p(m+3) preceding and succeeding the signal p(m) of high level ("H").

In FIG. 10, the shift register 15 includes NOR gates 521 to 526, NAND gates 531 to 536, inverters 541 to 546, NMOS (n-channel MOS) transistors 551 to 556, NMOS transistors 561 to 566, NMOS transistors 571 to 576, and NMOS transistors 581 to 586. Among the NMOS transistors 551 to 556, odd-numbered transistors receive a control signal sre#x through gates thereof, while even-numbered transistors receive a control signal sro#x through gates thereof. Among the NMOS transistors 561 to 566, odd-numbered transistors receive a control signal sle#x through gates thereof, while even-numbered transistors receive a control signal slo#x through gates thereof. These control signals sre#x, sro#x, sle#x, and slo#x are supplied from the phase detector 12. A reset signal RESET is a signal for initializing the shift register 15.

Signals p(m−2) to p(m+3) are transmitted through output terminals of the NOR gates 521 to 526, respectively.

In an initial state, the signal p(m) i.e., an output of the NOR gate 523, is high. For reducing the amount of delay which is to be produced by the delay line, the shift register is driven so that the signal p(m) becomes low ("L") and the signal p(m−1) becomes high ("H"). For this purpose, high level pulses are supplied as the control signal sle#x. When the control signal sle#x becomes high ("H"), the NMOS transistor 563 is turned ON (conductive state). The voltage level of an output of the inverter 543 that is currently high ("H") is forced to be low ("L"). As a result, the state of a latch composed of the inverter 543 and NAND gate 533 is reversed, and the voltage level of an output of the NAND gate 533 is forced to be high ("H"). This causes the voltage level of an output of the signal p(m) of the NOR gate 523 to become low ("L"). On the other hand, since the voltage level of an output of the inverter 543 is low ("L"), the voltage level of an output of the signal p(m−1) of the NOR gate 523 is forced to be high ("H").

In this state, for further reducing the amount of delay which is to be produced by the delay line, high level pulses should be given as the control signal slo#x. Thus, for decreasing the amount of delay by using any odd-numbered one of the NOR gates 521 to 526, the control signal sle#x is forced to be high ("H"). For reducing the magnitude of delay using any even-numbered one thereof, the control signal slo#x is driven high.

In the initial state shown in FIG. 10, for increasing the amount of delay which is to be produced by the delay line, the signal p(m) should be low ("L") and the signal p(m+l) should be high ("H"). For this purpose, high level pulses are supplied as the control signal sro#x. For further increasing the amount of delay which is to be produced by the delay line, high level pulses are supplied as the control signal sre#x. For increasing the amount of delay by using any odd-numbered one of the NOR gates 521 to 526, the control signal sro#x is forced to be high ("H"). For increasing the amount of delay using any even-numbered one thereof, the control signal sre#x is forced to be high ("H").

These control signals sre#x, sro#x, sle#x, and slo#x are supplied from the phase detector 12 for detecting the phase difference between the division clock signal and the delayed division clock signal. The phase detector 12 and divider 11 have no direct relation to the present invention. The details of the configurations of the phase detector and divider will be omitted.

As described previously, the signals p(1) to p(n) shown in FIGS. 9 and 10 are signals determining the amount of delay which is to be produced by the delay line included in the delay circuit portion, that is, the number of delay stages. As the frequency of an input signal which is to be sent to the delay line becomes higher, the cycle of the input signal is shortened. As a result, the amount of delay necessary to realize a desired phase delay is reduced. When the clock frequency of an external clock is relatively high (that is, the clock cycle tCLK is relatively short), the amount of delay which is to be set by the delay line is small (the number of delay stages is small). On the contrary, when the clock frequency is relatively low, the amount of delay which is to be set by the delay line is large (the number of delay stages is large). Now, this state will be expressed in relation to the signals p(1) to p(n). Namely, when the clock frequency of the external clock is relatively high, the value of "m" of the signal p(m) that is high ("H") is small. On the contrary, when the clock frequency is relatively low, the value of "m" of the signal p(m) that is high ("H") is large. In other words, the signals p(1) to p(n) directly reflect the clock frequency of the external clock. The signals p(1) to p(n) or signals relevant to these signals can be utilized as delay stage signals which are used to judge the clock frequency by the clock frequency judging circuit 20 (FIG. 6).

Figure 11:
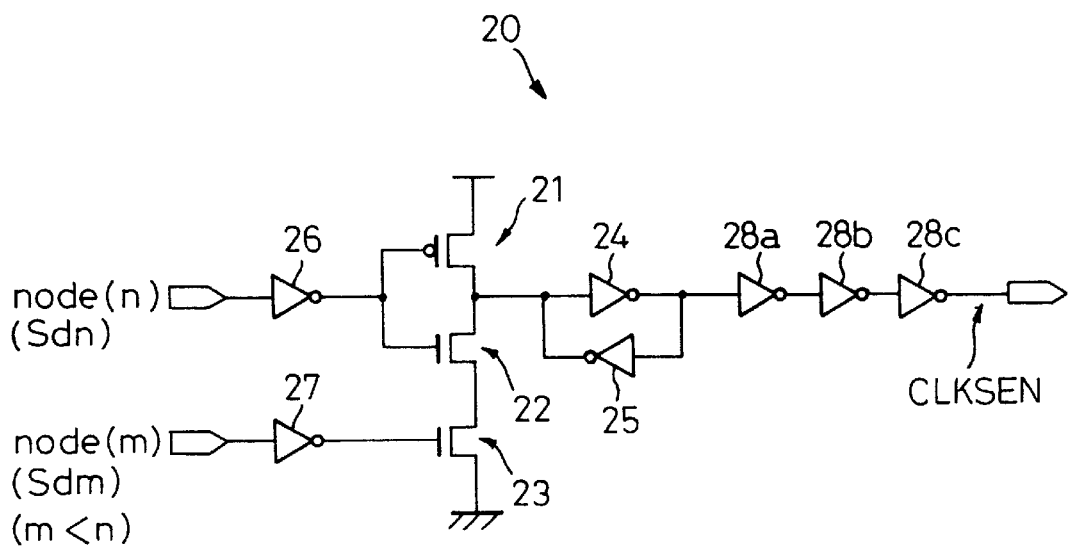
FIG. 11 is a circuit diagram showing a practical exemplary configuration of a clock frequency judging circuit in the embodiment shown in FIG. 6.

FIG. 11 is a circuit diagram showing a practical exemplary configuration of the clock frequency judging circuit in the embodiment shown in FIG. 6.

A clock frequency judging circuit 20 in FIG. 11 inputs two delay stage signals Sdm and Sdn (m<n), as mentioned in conjunction with FIG. 10. The delay stage signals Sdm and Sdn are selected from signals (that is, delay stage signals) Sd1 to Sdn which are obtained at nodes node(1) to node(n)

connected to the output terminals of the inverters 541 to 546 associated with the NOR gates that output signals p(1) to p(n), respectively. Namely, in the conceptual embodiment, the delay stage signals Sdm and Sdn obtained at the nodes node(m) and node(n) serve as judgment signals which are used to judge a clock frequency by the clock frequency judging circuit 20.

The voltage level of each of the signals Sd1 to Sdn are determined by defining the signal p(m) of high level ("H") as a boundary. That is to say, the signals Sd1 to Sdm associated with clock frequencies higher than a clock frequency corresponding to the signal p(m) are high ("H"), while the signals Sd(m+l) to Sdn associated with clock frequencies lower than a clock frequency corresponding to the signal p(m) are low ("L"). Once a signal Sdk (k<n) associated with a given clock frequency is selected in advance, when the clock frequency of an input clock is lower than a given frequency, the signal Sdk is forced to be high ("H"). When the clock frequency of the input clock is higher than the given frequency, the signal Sdk is forced to be low ("L"). The signal Sdk can therefore be used as a clock selection enabling signal CLKSEN as it is.

In short, the clock frequency judging circuit 20 in FIG. 11 identifies a specific node in the shift register (FIG. 10). Herein, the shift register controls the number of delay stages in the DLL circuit 10 whose output is locked. The clock frequency judging circuit 20 judges from the identified node whether or not the number of delay stages is set to a predetermined number of delay stages (for example, a number of delay stages k).

However, when the signal Sdk is used as the clock selection enabling signal CLKSEN as it is, a disadvantage may occur in that the clock frequency judging unit is susceptible to noise. An external clock which is to be supplied to a semiconductor device including a DRAM or the like is susceptible to noise even if only slightly. The number of delay stages in the delay circuit portion 10d changes a little due to an influence of noise. Assume that the clock frequency of an external clock is close to a predetermined frequency similar to the frequency of the signal Sdk. In this case, the number of delay stages in the delay circuit portion 10d changes due to an influence of noise. This causes the signal Sdk to make an irregular transition between a high level ("H") and low level ("L"). It is therefore not practically preferable to use the signal Sdk as the clock selection enabling signal CLKSEN as it is.

To remove this disadvantage, two kinds of signals Sdm and Sdn output from two arbitrary nodes node(m) and node(n) (m<n) in the shift register, respectively, are actually input to the clock frequency judging circuit 20 shown in FIG. 11. The clock frequency judging circuit 20 is thus provided with a hysteresis with respect to a change in a clock frequency. More particularly, the clock frequency judging circuit 20 includes a PMOS (p-channel MOS) transistor 21, an NMOS transistor 22 and an NMOS transistor 23 connected in series with each other. The inverters 24 and 25 constitute a latch by receiving the outputs of their mates as inputs.

In the thus configured clock frequency judging circuit 20, the signal Sdn obtained at the node node(n) is input to the PMOS transistor 21 and NMOS transistor 22, through the gates thereof, via the inverter 26. On the other hand, the signal Sdm obtained at the node node(m) is input to the NMOS transistor 23 through the gate thereof, via the inverter 27. Furthermore, a signal output from the latch composed of the inverters 24 and 25 is transmitted as a clock selection enabling signal CLKSEN to the clock selecting circuit by three inverters 28a, 28b, and 28c.

Figure 12:
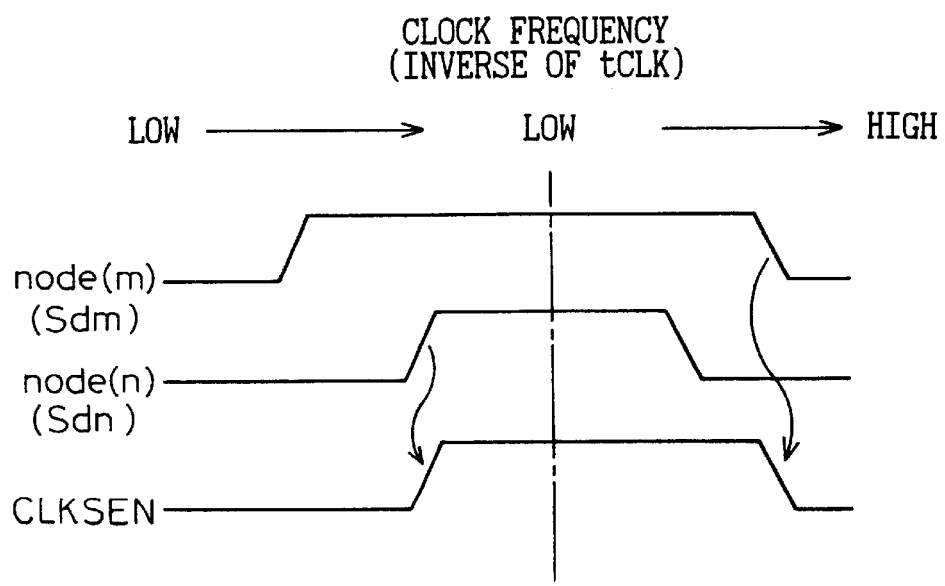
FIG. 12 is a timing chart for explaining the operations of the clock frequency judging circuit shown in FIG. 11.

FIG. 12 is a timing chart for explaining the operations of the clock frequency judging circuit shown in FIG. 11. Referring to FIGS. 11 and 12, the operations of the clock frequency judging circuit 20 will be described below.

To begin with, assume that the clock frequency of an external clock is sufficiently high (that is, the clock cycle tCLK of the external clock, is sufficiently short), and two kinds of signals Sdm and Sdn are low ("L"). At this time, the PMOS transistor 21 is in OFF state (nonconductive state), while the NMOS transistors 22 and 23 are in ON state (conductive state). An input of the inverter 24 therefore becomes low ("L"). The latch composed of the inverters 24 and 25 outputs a low level clock selection enabling signal CLKSEN.

When the clock frequency decreases gradually in this state, the signal Sdm becomes high ("H") and the signal Sdn remains low ("L"). The PMOS transistor 21 is then turned OFF, and the NMOS transistor 22 is turned ON. However, the NMOS transistor 23 is turned OFF. The input terminal of the inverter 24 becomes a floating state. The latch composed of the inverters 24 and 25 retains a state in which an output of the inverter 24 is high ("H"). The clock selection enabling signal CLKSEN remains low ("L").

When the clock frequency further decreases in this state, the signals Sdm and Sdn become high ("H"). At this time, the PMOS transistor 21 is in ON state, but the NMOS transistors 22 and 23 are in OFF state. An input of the inverter 24 therefore becomes high ("H") (each of the latch composed of the inverters 24 and 25 becomes low ("L")), and the clock frequency judging circuit 20 output a clock selection enabling signal CLKSEN that is high ("H"). The transition from "L" level to "H" level of the clock selection enabling signal CLKSEN is achieved accurately in accordance with the transition of both the two kinds of signals Sdm and Sdn. At this time, the above transition of the clock selection enabling signal CLKSEN is not affected by noise.

In contrast, when the clock frequency increases gradually in this state, the signal Sdm remains high ("H") and the signal Sdn becomes low ("L"). The PMOS transistor 21 is turned OFF but the NMOS transistor 22 is turned ON. The NMOS transistor 23 remains OFF, and the input terminal of the inverter 24 becomes a floating state. The latch composed of the inverters 24 and 25 retains a state in which an output of the inverter 24 is low ("L"). The clock selection enabling signal CLKSEN remains high ("H").

When the clock frequency further increases in this state, the signals Sdm and Sdn becomes low ("L"). At this time, the PMOS transistor 21 is turned OFF, and the NMOS transistors 22 and 23 are turned ON. An input of the inverter 24 therefore becomes low ("L") (each of the latch composed of the inverters 24 and 25 becomes low ("H")), and the clock frequency judging circuit 20 output the clock selection enabling signal CLKSEN that is low ("L"). The transition from "H" level to "L" level of the clock selection enabling signal CLKSEN is achieved accurately in accordance with the transition of both of the two kinds of signals Sdm and Sdn. At this time, the above transition of the clock selection enabling signal CLKSEN is not affected by noise.

The clock frequency judging circuit in the conceptual preferred embodiment of the present invention will be summarized. Namely, when a clock frequency decreases, a clock selection enabling signal CLKSEN does not become high ("H") until the clock frequency reaches a first frequency corresponding to the frequency of a signal Sdn. In contrast, when the clock frequency increases, the clock selection enabling signal CLKSEN does not become low ("L") until the clock frequency reaches a second frequency corresponding to the frequency of a signal Sdm. Note that the first frequency is lower than the second frequency. Even when the clock frequency of an external clock varies due to an influence of noises, as long as the amplitude of the variation of the clock frequency is smaller than the difference in amplitude between the first frequency and second frequency, the clock selection enabling signal CLKSEN will not be affected by the noises. Thus, the clock selection enabling signal CLKSEN can be produced which is to be unsusceptible to a variation caused by noises.

Figure 13:
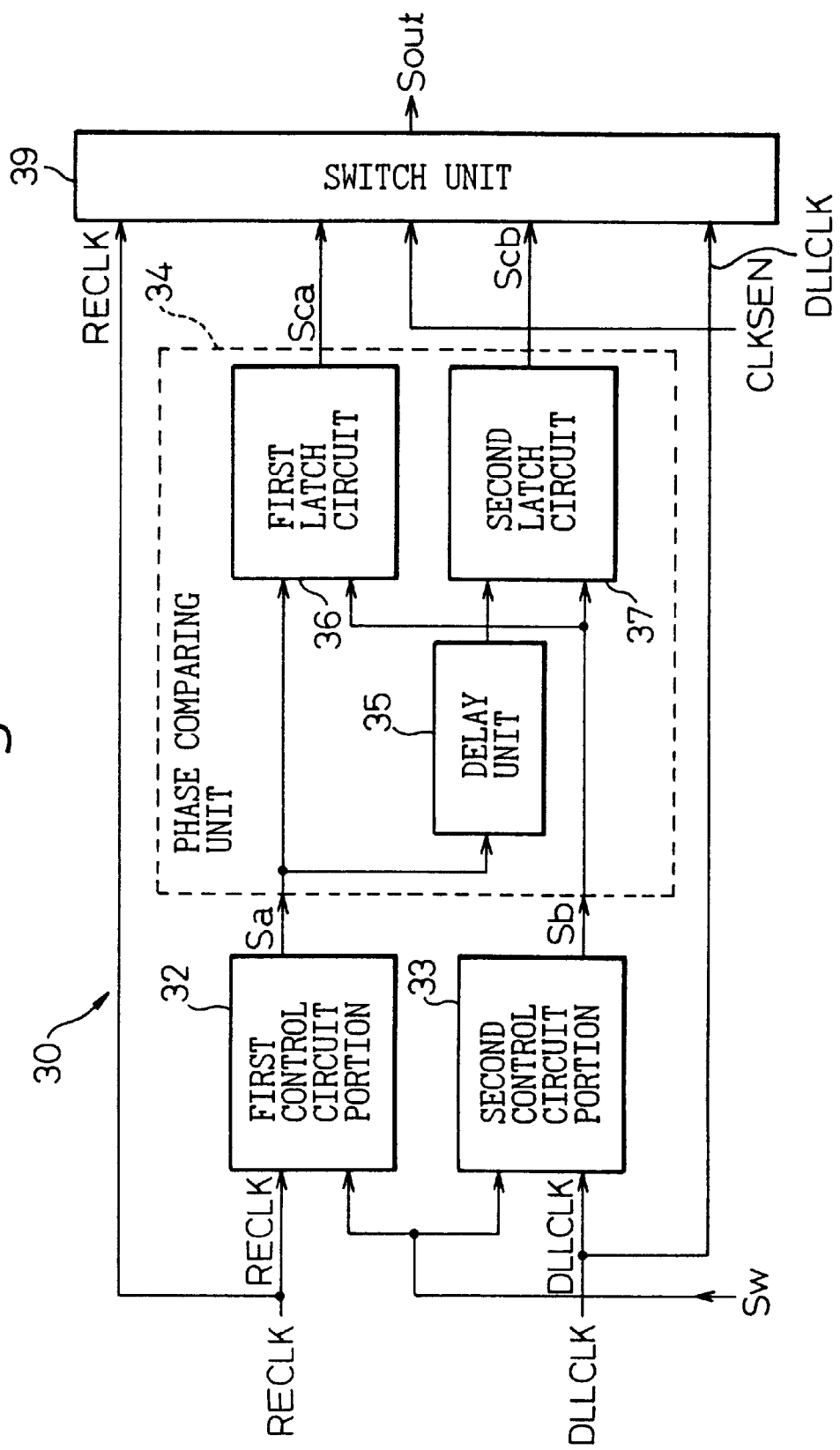
FIG. 13 is a circuit diagram showing a practical exemplary configuration of a clock selecting circuit in the embodiment shown in FIG. 6.

FIG. 13 is a circuit diagram showing a practical exemplary configuration of a clock selecting circuit in the embodiment shown in FIG. 6. In FIG. 13, there are shown a first control circuit portion (frequency divider) 32, a second control circuit portion (frequency divider) 33, a delay unit (delay element) 35, a first latch circuit (RS flip-flop) 36, a second latch circuit (RS flip-flop) 37, and a switch unit 39. Herein, the delay unit 35, first latch circuit 36, and second latch circuit 37 constitute a phase comparing unit 34.

In the aforesaid embodiment shown in FIG. 6, a DLL clock DLLCLK that lags behind an external clock by a given phase may be used as an internal clock. In this case, the clock frequency judging circuit 20 judges whether or not the phase of the real clock RECLK can be accurately compared with the phase of a DLL clock DLLCLK, according to the number of delay stages in the DLL circuit whose output is locked.

As mentioned previously, when it is judged that the phase of the real clock can be accurately compared with the phase of the DLL clock, a high level ("H" level) clock selection enabling signal CLKSEN is input to the switch unit 39 in the clock selecting circuit 30. As described later, the phase comparing unit 34 in the clock selecting circuit 30 compares the phase of the real clock with the phase of the DLL clock within a window that is the cycle of a window pulse signal Sw. Consequently, a clock that is relatively leading is extracted by controlling the switch unit 39 on the basis of output signal Sca or Scb. In this condition, the output signal Sca or Scb for selecting the clock which is relatively leading is input to the switch unit 39, and either the real clock RECLK or the DLL clock DLLCLK is selected as an internal clock of the semiconductor device (selection clock signal Sout). In contrast, when the clock frequency is relatively high, it may be judged that the phase of the real clock cannot be accurately compared with the phase of the DLL clock. In this case, a low level ("L" level) clock selection enabling signal CLKSEN is input to the switch unit 39 in the clock selecting circuit 30. At this time, the switch unit 39 the prevents the real clock from being output and operates so that only DLL clock is output. Namely, the DLL clock is selected unconditionally as the internal clock of the semiconductor device.

In short, the clock selecting circuit 30 shown in FIG. 13 accurately compares the phase of the real clock that is a first signal with the phase of the DLL clock that is a second signal, under the control of the clock frequency judging circuit 20 that supplies the clock selection enabling signal CLKSEN. In FIG. 13, the first control circuit portion 32 divides the frequency of the real clock that is the first signal with a submultiple of N (for example, N=4), according to a window pulse signal Sw that is a third signal. In contrast, the second control circuit portion 33 divides the frequency of the DLL clock that is the second signal with a submultiple of N, according to the window pulse signal Sw that is the third signal. Herein, N denotes an integer equal to or larger than 2.

An output signal Sb of the second control circuit portion 33 is supplied to the first and second latch circuits 36 and 37.

On the other hand, an output signal Sa of the first control circuit portion 32 is supplied to the first latch circuit 36. The output signal Sa is also supplied to the second latch circuit 37, via the delay unit 35 realized by a delay element for adjusting a phase.

Namely, in the clock selecting circuit in the conceptual embodiment of the present invention, the first control circuit portion 32 and second control circuit portion 33 divide the frequencies of the first and second signals with the submultiples of N (for example, N=4), according to the same timing, respectively. At this time, both the first and second control circuit portions use the third signal as a reference. Outputs of the first and second control circuit portions are provided as the frequency division output signals Sa and Sb. The frequency division output signals Sa and Sb are compared with each other by using the two latch circuits 36 and 37. If it is judged that the first signal is leading the second signal, an output signal Sca corresponding to the first signal is output from the first latch circuit 36. By contrast, if the second signal is leading the first signal, an output signal Scb corresponding to the second signal is output from the second latch circuit 37.

Now, the first and second control circuit portions (frequency dividers) 32 and 33 are not limited to a circuitry for dividing the frequency of an input signal (the real clock that is the first signal or the DLL clock that is the second signal) with a submultiple of 4. Herein, this circuitry outputs a signal that becomes high ("H") during a period coincident with two initial cycles of the input signal and becomes low ("L") during a period coincident with two subsequent cycles. Alternatively, the first and second control circuit portions may have another circuitry for outputting a signal that becomes high ("H") during a period coincident with one initial cycle of the input signal and becomes low ("L") during a period coincident with three subsequent cycles. Namely, the first or second control circuit portion 32 or 33 produces an output signal that becomes a first level (for example, a high level) during a period coincident with Y cycles of each of the first and the second input signal, and becomes a second level (for example, a low level) during a period coincident with Z cycles thereof (and Y+Z=N (submultiples of N)).

Figure 14:
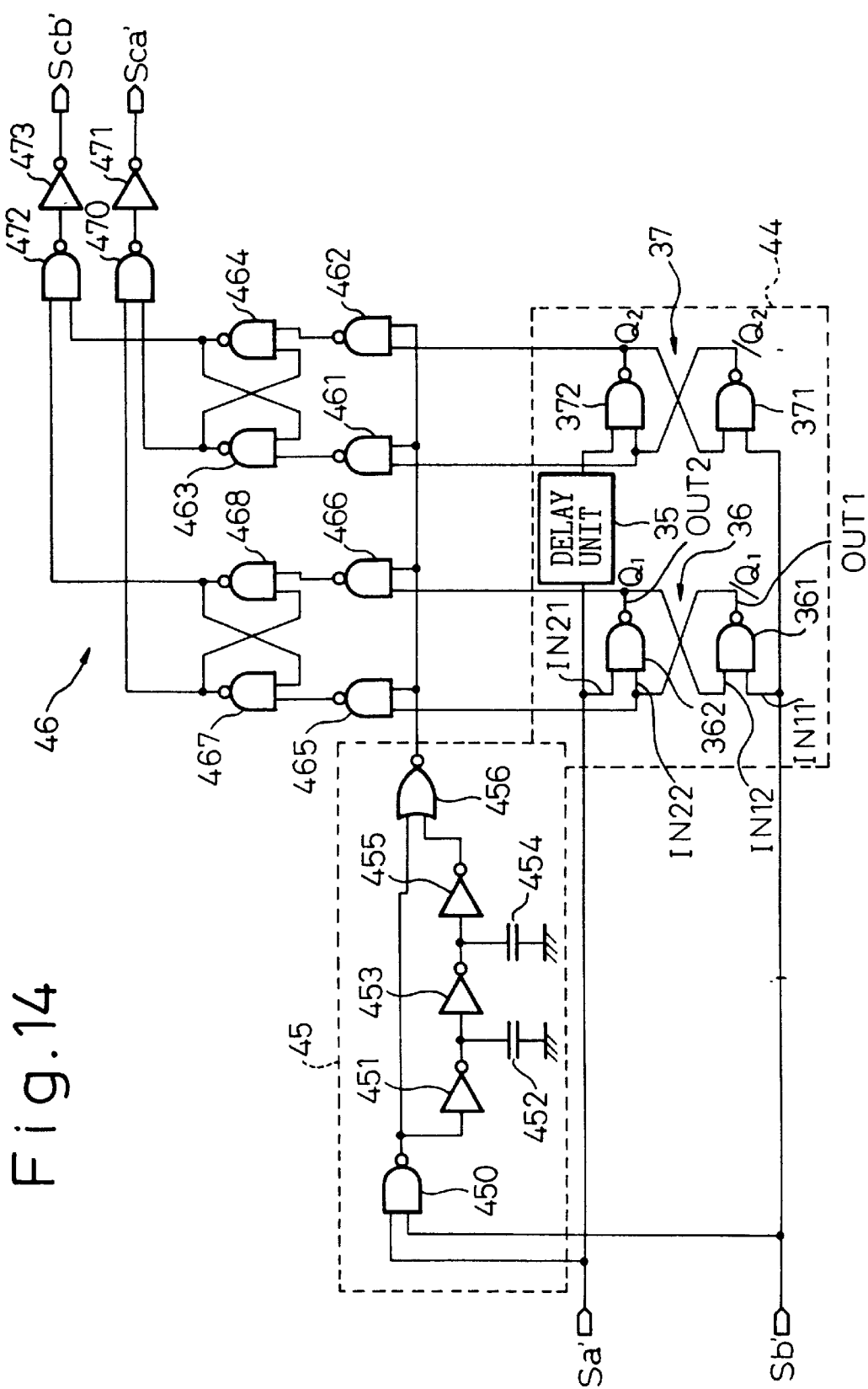
FIG. 14 is a circuit diagram showing an exemplary configuration of a phase comparing unit included in the clock selecting circuit shown in FIG. 13.

FIG. 14 is a circuit diagram showing an exemplary configuration of a phase comparing unit in the clock selecting circuit shown in FIG. 13.

As shown in FIG. 14, the phase comparing circuit 34 includes a latch circuit portion 44 for latching a signal Sa' generated by dividing the frequency of the real clock RECLK (for example, the output signal Sa of the first control circuit portion 32 shown in FIG. 13) and a signal Sb' generated by dividing the frequency of the DLL clock DLLCLK (for example, the output signal Sb of the second control circuit portion 33 shown in FIG. 13); and a timing signal generating circuit portion 45 for generating a timing signal necessary for the phase comparison between the real clock RECLK and the DLL clock DLLCLK.

The phase comparing circuit 34 further includes a phase judging circuit portion 46 for judging which clock is relatively leading between the real clock RECLK and the DLL clock DLLCLK, by using output signals of the latch circuit portion 44 and an output signal of the timing signal generating circuit portion 45 as input signals of the phase judging circuit portion 46, and for generating an output signal Sca' or an output signal Scb' (for example, the output signal Sca of the first latch circuit 36 or the output signal Scb of the second latch circuit 37 shown in FIG. 13).

As shown in FIG. 14, the first latch circuit 36 and second latch circuit 37 included in the latch circuit portion 44 are realized by RS flip-flops each composed of two NAND gates 361 and 362 and two NAND gates 371 and 372, respectively. A signal Sa' of the first control circuit portion 32 which is produced by dividing the real clock RECLK by a submultiple is applied to a set input terminal of the first RS flip-flop (first latch circuit 36). A signal Sb' of the second control circuit portion 33 which is produced by dividing the DLL clock by a submultiple is applied to a reset input terminal of the first RS flip-flop. Furthermore, the above signal Sa' of the first control circuit portion 32 is applied to a set input terminal of the second RS flip-flop (second latch circuit 37) via the delay unit 35. The output signal Sb' of the second control circuit portion 33 is applied to a reset input terminal of the second RS flip-flop. Output signals $Q_1$, $/Q_1$, $Q_2$, and $/Q_2$ of the first and second RS flip-flops (corresponding to the aforesaid output signals Sca and Scb) are adequately combined with each other, in order to judge a result of the phase comparison. Strictly speaking, if the result of the above phase comparison is to be judged accurately, the timing signal mentioned above need be produced. In the above phase comparing unit 34, the result of the phase comparison is judged at the timing of the rising edge of each of the signals Sa' and Sb'.

Now, in the first RS flip-flop (or second RS flip-flop), a first input terminal IN11 of the first NAND gate 361 (or 371) is defined as the reset input terminal of the RS flip-flop. A second input terminal IN12 of the first NAND gate 361 as well as an output terminal OUT2 of the second NAND gate 362 (or 372) is connected to an output terminal $Q_1$ (or $Q_2$) of the RS flip-flop. A first input terminal IN21 of the second NAND gate 362 (or 372) is regarded as the set input terminal of the RS flip-flop. A second input terminal IN22 of the second NAND gate 362 (or 372) as well as an output terminal OUT1 of the first NAND gate 361 (or 371) is connected to an inverted output terminal $/Q_1$ (or $/Q_2$) of the RS flip-flop.

Further, the timing signal generating circuit portion 45 has a NAND gate 450 to which the signals Sa' and Sb' are supplied as input signals; three inverters 451, 453 and 455 connected in series with each other for delaying the output signals of the NAND gate 450; two capacitors 452, 454 for delaying the output signals; and a NOR gate 456. The output signal of the NAND gate 450 and the output signal of the inverter 455 at the third stage are input to the NOR gate 456. A pulse (timing signal) in which the timing of the rising edge is adjusted on the basis of the inverters 451, 453 and 455 or the like, is output from the NOR gate 456.

Further, the phase judging circuit portion 46 has two NAND gates 465, 466 to which output signals $/Q_1$, $Q_1$ of the first latch circuit 36 are input, respectively; and a first phase judging latch circuit consisting of two NAND gates 467, 468 connected to output terminals of the two NAND gates 465, 466, respectively. On the other hand, the phase judging circuit portion 46 has two NAND gates 461, 462 to which output signals $/Q_2$, $Q_2$ of the second latch circuit 37 are input, respectively; and a second phase judging latch circuit consisting of two NAND gates 463, 464 connected to output terminals of the two NAND gates 461, 462, respectively. The timing signal output from the timing signal generating circuit portion 45 is input to one of input terminals in each of the NAND gates 461, 462, 465 and 466. Further, the phase judging circuit portion 46 has two NAND gates 470, 472; and two inverters 471, 473 connected to output terminals of the two NAND gates 470, 472, respectively. An output signal of the first phase judging latch circuit and an output signal of the second phase judging latch circuit are input to two input terminals of one NAND gate 470, respectively. On the other hand, an inverted output signal of the first phase judging latch circuit and an inverted output signal of the second phase judging latch circuit are input to two input terminals of another NAND gate 472, respectively.

In this case, when the phase of the real clock RECLK is leading relative to the phase of the DLL clock DLLCLK, the output signal Sca' output from one inverter 471 becomes "H". On the contrary, when the phase of the DLL clock DLLCLK is leading relative to the phase of the real clock RECLK, the output signal Scb' output from another inverter 473 becomes "H". In the case in which the relationship concerning the lead or lag of the phase between the real clock RECLK and the DLL clock DLLCLK is different at the position before the delay unit 35 and at the position after the delay unit 35, it is judged that the phase of the real clock RECLK is substantially the same as that of the DLL clock DLLCLK. Consequently, both the output signal Sca' and the output signal Scb' become "L". However, even in this case, at the timing in which the signal Sa' has not yet passed through the delay unit 35, the phase of the signal Sa' is leading relative to the phase of the output signal Sb'. Therefore, switch circuits in the switch unit 39 operate so as to select the real clock RECLK.

Figure 15:
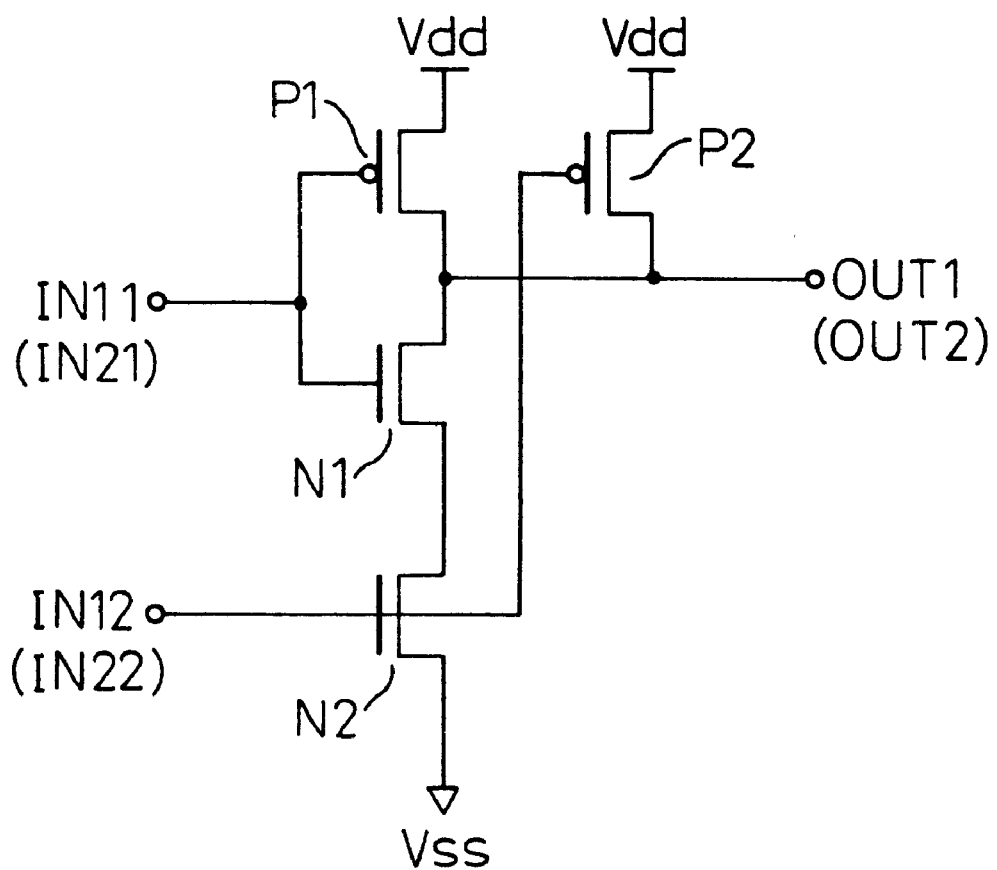
FIG. 15 is a circuit diagram showing an exemplary configuration of a NAND gate included in the phase comparing unit shown in FIG. 14.

FIG. 15 is a circuit diagram showing an example of a AND gate in the phase comparing unit shown in FIG. 14.

As shown in FIG. 15, the NAND gates (for example, 361, 362, 371, and 372) in FIG. 14 are each composed of two PMOS transistors P1 and P2, and two NMOS transistors N1 and N2.

The source of the first PMOS transistor P1 is connected on a first power supply line (high potential power supply line) Vdd, and the drain thereof is connected to the output terminal OUT1 (or OUT2) of the NAND gate. The gate thereof is connected to the first input terminal IN11 (or IN21) of the NAND gate. The source of the second PMOS transistor P2 is connected on the first power line Vdd, the drain thereof is connected to the output terminal OUT1 (or OUT2) of the NAND gate. The gate thereof is connected to the second input terminal IN12 (or IN22) of the NAND gate.

Furthermore, the source of the first NMOS transistor N1 is connected to the drain of the second NMOS transistor N2. The drain of the first NMOS transistor N1 is connected to the output terminal OUT1 (or OUT2) of the NAND gate, and the gate thereof is connected to the first input terminal IN11 (or IN21) of the NAND gage. Moreover, the source of the second NMOS transistor N2 is connected on a second power supply line (low potential power supply line) Vss, and the gate thereof is connected to the second input terminal IN12 (or IN22) of the NAND gate. Herein, MOS transistors (P1, P2, N1, and N2) are used as transistors constituting the NAND gate. However, the transistors constituting the NAND gate are not limited to MOS (MIS) transistors. Furthermore, the configuration of the phase comparing unit 34 is not limited to the aforesaid one. Other various configurations would be conceivable.

As shown in FIGS. 14 and 15, the configuration of the set input terminals, reset input terminals and the like of both the first and second latch circuits (RS flip-flops) 36 and 37 in the phase comparing unit 34 are specified. Consequently, uncertainties in the response of the output signals ($Q_1$, $/Q_1$, $Q_2$, and $/Q_2$) to the level change of an input signal (real clock or DLL clock) can be minimized so that the accurate phase comparison can be carried out. In other words, the two input terminals of the NAND gate are not designed to be completely symmetrical to each other. Unless the signals which are to be applied to the input terminals (IN1 and IN2) are specified, a slight difference may occur concerning the timing of the operations in the input terminals of the NAND gate.

Figure 16:
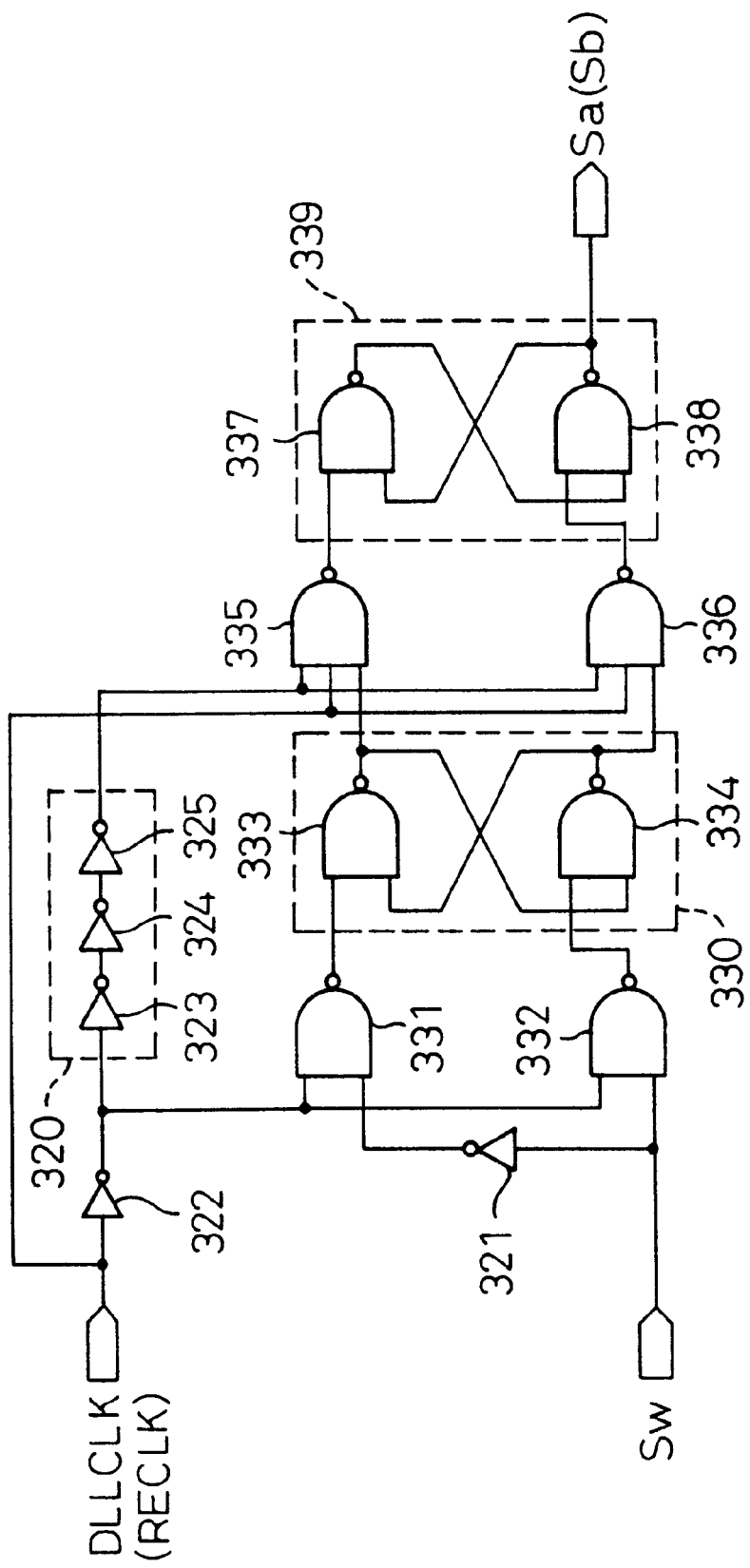
FIG. 16 is a circuit diagram showing an exemplary configuration of a control circuit portion included in the clock selecting circuit shown in FIG. 13.

FIG. 16 is a circuit diagram showing an exemplary configuration of the control circuit portion of the clock selecting circuit shown in FIG. 13. The configuration of either one of the first control circuit portion 32 and second control circuit portion 33 is illustrated as a typical example.

As shown in FIG. 16, the first control circuit portion 32 (or second control circuit portion 33) inputs a real clock RECLK that is a first input signal (or a DLL clock DLLCLK that is a second input signal) and a window pulse signal Sw that is a third signal. The first control circuit portion 32 outputs an output signal Sa (or Sb) corresponding to the real clock that has a submultiple of the frequency thereof (a submultiple of 4) divided according to the third signal. The first control circuit portion 32 is composed of a plurality of NAND gates 331 to 338 and a plurality of inverters 321 to 325. The real clock that is the first input signal is applied to either one of the input terminals of each of the NAND gates 331 and 332 via the inverter 322. The real clock is also applied to the first input terminals of the NAND gates 335 and 336, each of which have three input terminals, via the inverter 322 and the delay unit 320 composed of the inverters 323 to 325. Furthermore, the third signal is applied to the other one of input terminal of the NAND gate 332 The third signal is also applied to the other input terminal of the NAND gate 331 via the inverter 321. The real clock that is the first input signal is applied directly to the second input terminals of the NAND gates 335 and 336 each having three input terminals.

Outputs of the NAND gates 331 and 332 are held in a first latch 330 that is composed of the NAND gates 333 and 334. An output of the first latch 330 is applied to the third input terminals of the NAND gates 335 and 336 each having three input terminals. The real clock that is the first input signal makes the transition from "L" level to "H" level, and a signal delayed by the delay unit 320 remains high ("H"). According to this timing, an output of the first latch 330 is transferred to a second latch 339 composed of the NAND gates 337 and 338. Thus, the first signal (or second signal) and third signal are used to produce the output signal Sa (Sb) whose frequency is divided.

Specifically, a signal produced by inverting the first signal (or second signal) by the inverter 322 is used to trigger the third signal. The third signal is triggered by the above inverted signal and then stored in the first latch 330. A complementary signal that is held in the first latch 330 is triggered by the first signal (or second signal) and stored in the second latch 339 so as to output the corresponding data.

Figure 17:
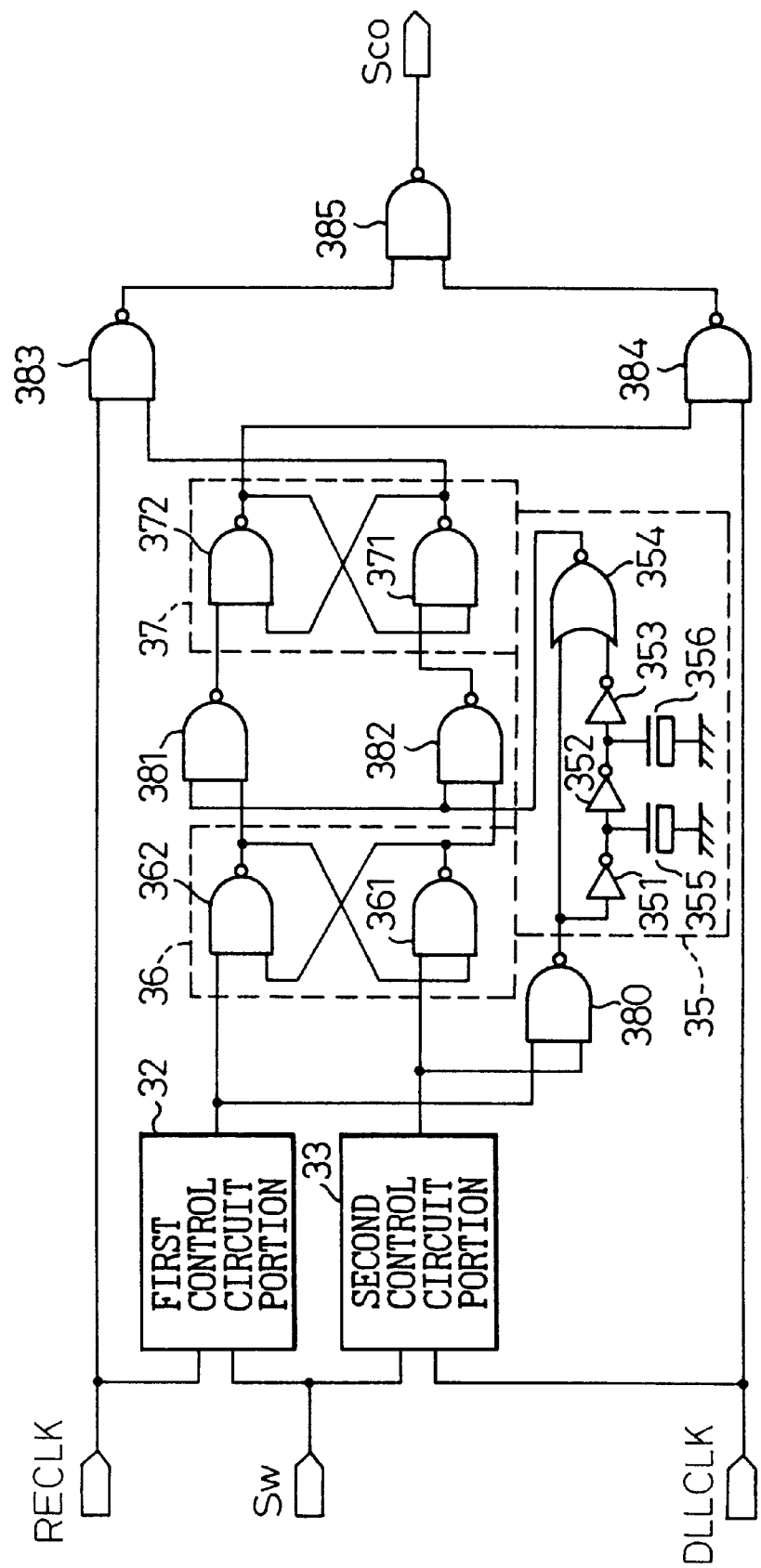
FIG. 17 is a circuit diagram showing an exemplary circuitry for realizing an ability of the clock selecting circuit shown in FIG. 13 to select and output either one of a real clock and DLL clock.

FIG. 17 is a circuit diagram showing an exemplary circuitry for realizing an ability of the clock selecting circuit shown in FIG. 13 to select and output either one of the real clock and the DLL clock. In short, the exemplary circuitry shown in FIG. 17 is another exemplary configuration of the clock selecting circuit in accordance with the conceptual embodiment of the present invention.

As is apparent from the comparison of FIG. 17 with FIGS. 13, and 14, a clock selecting circuit shown in FIG. 17 consists of NAND gates 380 to 385, in addition to the first control circuit portion 32, second control circuit portion 33, delay unit 35, first latch circuit 36', and second latch circuit 37'. The clock selecting circuit selects and outputs either one of a real clock (first signal) and a DLL clock (second signal) applied to input terminals IN01 and IN02, respectively. It should be noted that the two latch circuits 36, 37 are connected in parallel with each other in FIG. 13, whereas the two latch circuits 36', 37' connected in series with each other in FIG. 17. A third signal is, for example, a signal whose frequency is divided by a submultiple of 4 as shown in FIG. 2. A signal output from an input buffer (a signal whose phase has not been controlled by a DLL circuit, that is, a real clock) may be used as the first signal.

Now, the delay unit 35 is composed of inverters 351 to 353 connected in series with each other, capacitors 355 and 356, and a NOR gate 354. With a signal having a given pulse duration and being produced by the delay unit 35, data (complementary output) held in the first latch circuit 36' is transmitted to the second latch circuit 37'. The first signal or second signal (real clock or DLL clock) is output via one of the NAND gates 383 and 384, which is selected in accordance with an output of the second latch circuit 37', and the NAND gate 385.

Figure 18:
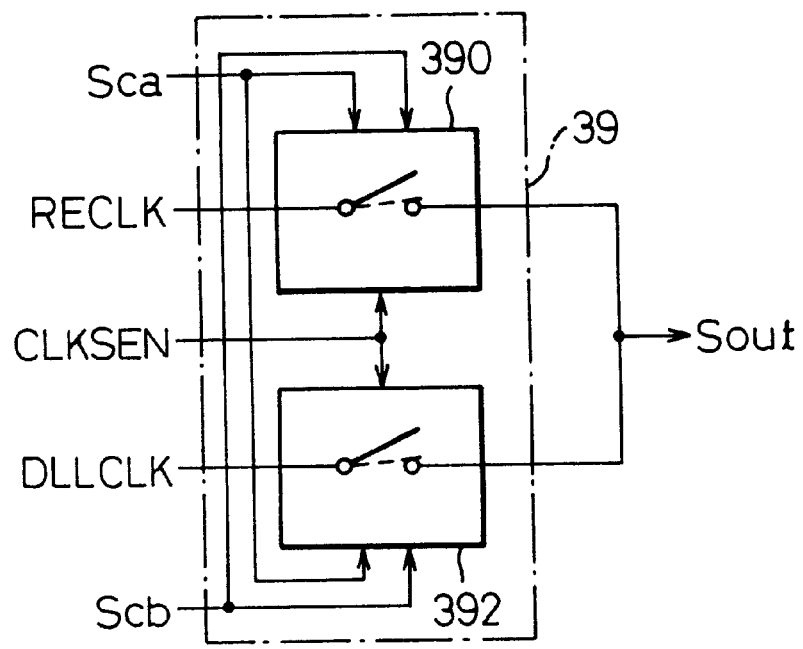
FIG. 18 is a circuit diagram showing a conceptual configuration of a switch unit included in the clock selecting circuit shown in FIG. 13.

FIG. 18 is a circuit diagram showing a conceptual configuration of the switch unit in the clock selecting circuit shown in FIG. 13.

As shown in FIG. 18, the switch unit 39 includes a first switching circuit 390 for selecting whether or not a real clock should be output as a selection clock signal Sout, and a second switching circuit 392 for selecting whether or not a DLL clock should be output as the selection clock signal Sout. The selecting operations of the first and second switching circuits 390 and 392 are controlled by using a clock selection enabling signal CLKSEN and the two output signals Sca and Scb output from the phase comparing unit 34.

As described previously, when the clock frequency of an external clock is relatively high, the clock selection enabling signal CLKSEN becomes low ("L"). The control is carried out so that the real clock is not output and only the DLL clock is output. Namely, when the clock frequency is relatively high, the clock selecting circuit does not compare the phase of one clock with the phase of another clock. The DLL clock is always used as an internal clock.

In contrast, when the clock frequency of an external clock is relatively low, the clock selection enabling signal CLKSEN becomes high ("H"). The phase of a real clock output via the first switching circuit 390 is compared with the phase of a DLL clock output via the second switching circuit 392. The operations of the first and second switching circuits 390, 392 are controlled so as to output either one of the two clocks that is relatively leading, on the basis of the two output signals Sca and Scb produced as a result of the phase comparison between the real clock and the DLL clock.

Figure 19:
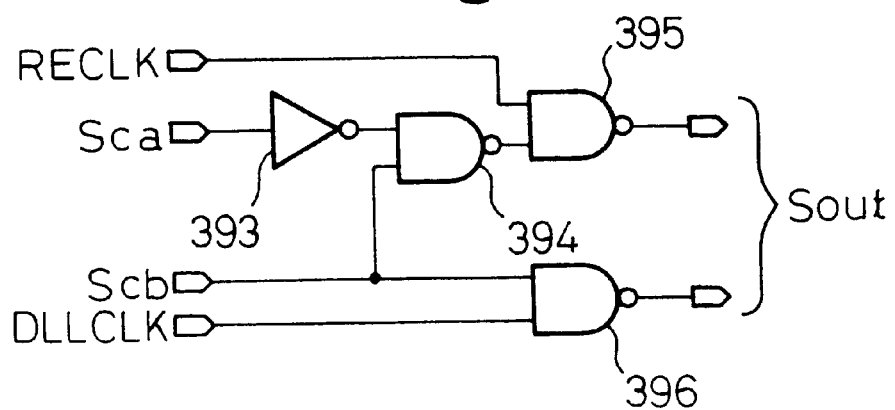
FIG. 19 is a circuit diagram showing a practical exemplary configuration of a switch unit in the embodiment shown in FIG. 6.

FIG. 19 is a circuit diagram showing a practical exemplary configuration of a switch unit (only main part of the switch unit is illustrated in this figure) in the embodiment shown in FIG. 6.

The switch unit 39 shown in FIG. 19 has an inverter 393, and three NAND gates 394, 395 and 396. One output signal Sca of the phase comparing unit 39 is input to the inverter 393. An output signal of the inverter 393 and another output signal Scb of the phase comparing unit 39 are input to two input terminals of the first NAND gate 394, respectively. The real clock RECLK and an output signal of the first NAND gate 394 are input to two input terminals of the second NAND gate 395, respectively. The above output signal Scb and the DLL clock DLLCLK are input to two input terminals of the third NAND gate 396, respectively.

When both of the output signals Sca and Scb of the phase comparing unit 39 become "L" in the switch unit 39 shown in FIG. 19, switch unit 39 operates so as to automatically select the real clock RECLK.

On the other hand, when one output signal Sca becomes "H" and another output signal Scb becomes "L", the switch unit 39 operates so as to select the real clock RECLK. Further, when one output signal Sca becomes "L" and another output signal Scb becomes "H", the switch unit 39 operates so as to select the DLL clock DLLCLK.

Figure 20:
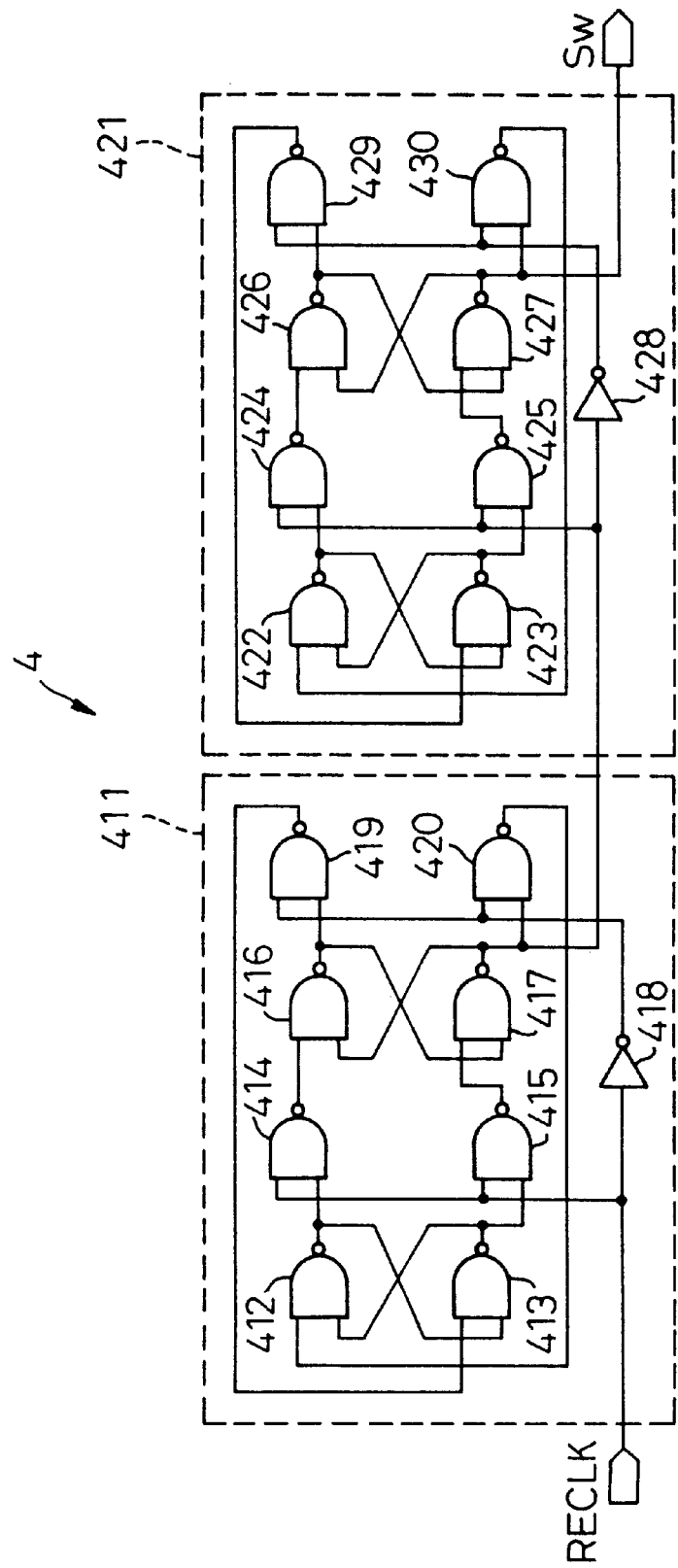
FIG. 20 is a circuit diagram showing a practical exemplary configuration of a division circuit in the embodiment shown in FIG. 6.

FIG. 20 is a circuit diagram showing a practical exemplary configuration of a division circuit in the embodiment shown in FIG. 6. As shown in FIG. 20, a frequency divider 4 is composed of two stages of counters 411 and 421. The counters 411 and 421 are realized by a plurality of NAND gates (412 to 417, 419, 420, 422 to 427, 429, and 430) and a plurality of inverters (418 and 428).

The frequency divider 40 shown in FIG. 20 receives an input signal such as a real clock applied to an input terminal thereof. The frequency divider 4 outputs a third signal (for example, a window pulse signal Sw) whose cycle is used as a window for comparing the phase of the real clock with the phase of the DLL clock, that is defined as a fraction of the frequency of the real clock or DLL clock divided by the two stages of counters. Needless to say, the frequency divider 4 is not limited to the circuitry composed of two stages of counters that are realized by a plurality of NAND gates and a plurality of inverters. Alternatively, the frequency divider 4 may be configured by combining various logic gates.

Figure 21:
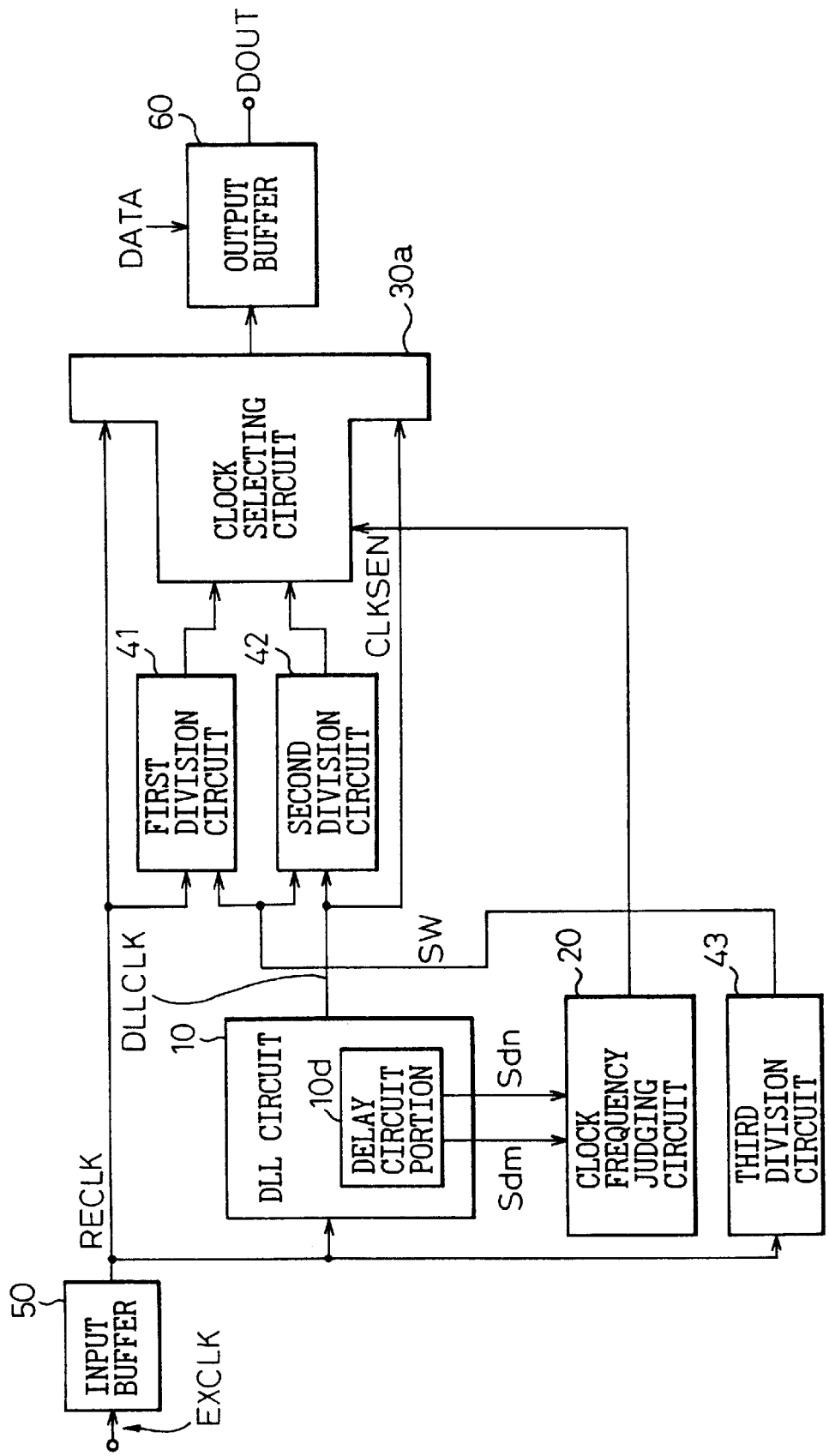
FIG. 21 is a circuit block diagram showing a concrete embodiment of the present invention.

FIG. 21 is a circuit block diagram showing a configuration of a concrete embodiment of the present invention. In the concrete embodiment shown in FIG. 21, a first division circuit 41 and a second division circuit 42 each having an ability to divide the frequency of the real clock or DLL clock are disposed at the input side of a clock selecting circuit 30a.

The clock selecting circuit 30a in FIG. 21 resembles the clock selecting circuit in the conceptual embodiment. Namely, the clock selecting circuit 30a is designed to compare the phase of a DLL clock with the phase of a real clock under the control of a clock frequency judging circuit 20. Herein, the clock frequency judging circuit 20 produces a selection enabling signal CLKSEN. The clock selecting circuit 30a then selects a clock, which is relatively leading, as a clock with which data DATA is synchronized. In addition to the two frequency division clock signals produced by dividing the frequencies of the real clock and DLL clock, respectively, signals whose frequencies are not obtained by dividing the frequencies of the real clock and DLL clock are input to the clock selecting circuit 30a.

Now, when the clock frequency of an external clock is relatively high, the signal whose frequency is not obtained by dividing the frequency of the DLL clock can be selected and output easily. In contrast, when the clock frequency of the external clock is relatively low, the two frequency division clock signals whose frequencies are obtained by dividing the frequencies of the real clock and DLL clock are input to the clock selecting circuit 30a. The clock selecting circuit 30a compares the phase of the real clock with the phase of the DLL clock, and thus accurately detects a clock that is relatively leading. When the number of delay stages in a DLL circuit 10, whose output is locked, is extremely large, the DLL circuit is halted. The signal whose frequency is not obtained by dividing the frequency of the real clock can be selected and output easily. A third division circuit 43 for producing a window pulse signal Sw has the same capability as the division circuit 4 in the conceptual embodiment (FIG. 6).

In the first division circuit 41 and the second division circuit 42 in the concrete embodiment shown in FIG. 21, it is necessary to divide the frequency of each of the two clock at the same timing. Therefore, a window pulse signal Sw is simultaneously supplied to the first and second division circuits 41, 42.

Even the concrete embodiment can provide the same advantages as the conceptual embodiment. That is to say, when the clock frequency of an external clock is relatively high, it can be judged adequately whether or not the phase of a real clock should be compared with the phase of a DLL clock. Consequently, a clock that is relatively leading can be accurately selected. The concrete embodiment can therefore deal with a sufficiently wide range of clock frequencies. Further, the operations of the DLL circuit or the like can be halted dependent on the clock frequency. Therefore, a power consumption required by the unnecessary operations of the DLL circuit or the like can be minimized.

As described so far, according to typical embodiments of a semiconductor device of the present invention, first, whether or not the phase of a first clock, such as a real clock, should be compared with the phase of a second clock, such as a DLL clock, is controlled based on a result of a judgment made concerning the clock frequency of an external clock. Consequently, both the two clocks can be used adequately in accordance with a clock frequency. Eventually, a wider range of clock frequencies than that in a conventional technique can be handled. Moreover, a DLL circuit or the like may be halted dependent on the clock frequency and power consumption can therefore be minimized.

Furthermore, according to typical embodiments of a semiconductor device of the present invention, second, the number of delay stages in a DLL circuit or the like whose output is locked onto a reference signal is detected. This makes it possible to accurately control whether or not the phase of a first clock, such as a real clock, should be compared with the phase of a second clock, such as a DLL clock. Selecting a clock or switching one clock to another clock can be carried out smoothly.

Furthermore, according to typical embodiments of a semiconductor device of the present invention, third, a clock frequency judging unit for comparing the phase of a first clock, such as a real clock, with the phase of a second clock, such as a DLL clock, is provided with a hysteresis. A result of a judgment made by the clock frequency judging unit can therefore be prevented from varying often depending on an operating environment of a semiconductor device.

Furthermore, according to typical embodiments of a semiconductor device of the present invention, fourthly, when a clock frequency becomes higher than a certain reference value, the phase of a first clock is not compared with the phase of a second clock. In this case, the second clock such as a DLL clock is selected unconditionally. Consequently, it is possible to handle a relatively wide range of clock frequencies, and especially, high clock frequencies.

What is claimed is:

1. A semiconductor device comprising:
   a clock phase adjusting circuit receiving a first clock for producing a second clock that lags behind said first clock by a predetermined phase, and outputting an indication signal to indicate a delay value of said first clock;
   a clock frequency judging unit for judging frequency of said first clock based on the indication signal to output a control signal; and
   a clock selecting unit coupled to receive said first clock and said second clock for selecting either one of said first clock and said second clock, in response to said control signal.

2. A semiconductor device according to claim 1, wherein said clock phase adjusting circuit includes a delay circuit portion having delay stages for delaying a phase of said first clock, and said indication signal is a signal indicating a number of delay stages in said delay circuit portion.

3. A semiconductor device according to claim 1, wherein said clock frequency judging unit has hysteresis characteristics in order to prevent a signal level of said control signal from varying often depending on an operating environment of said semiconductor device.

4. A semiconductor device according to claim 1 wherein, when said control signal indicated that the frequency of said first clock is higher than a predetermined reference value, said clock selecting unit does not compare a phase of said first clock with a phase of said second clock and output said second clock.

5. A semiconductor device comprising:

a clock phase adjusting circuit to which a first clock is input for producing a second clock synchronized with said first clock by delaying said first clock through a variable delay circuit and outputting an indication signal to indicate a delay value of said first clock;

a clock frequency judging circuit coupled to received said indication signal for judging frequency of said first clock, to output a control signal; and a clock selection unit coupled to receive said first clock and second clock for selecting either one of said first clock and said second clock, in response to said control signal to output a selected signal to an internal circuit.

* * * * *